US012810256B2

(12) United States Patent
Rawas

(10) Patent No.: US 12,810,256 B2
(45) Date of Patent: Nov. 24, 2026

(54) AUTOMATED PLATFORM HANDLING SOLUTION

(71) Applicant: CHEP Technology Pty Limited, Sydney (AU)

(72) Inventor: Oussama Fayez Rawas, Orlando, FL (US)

(73) Assignee: CHEP Technology Pty Limited, Sydney (AU)

( * ) Notice: Subject to any disclaimer, the term of this patent is extended or adjusted under 35 U.S.C. 154(b) by 14 days.

(21) Appl. No.: 19/270,899

(22) Filed: Jul. 16, 2025

(65) Prior Publication Data

US 2026/0024057 A1 Jan. 22, 2026

Related U.S. Application Data

(60) Provisional application No. 63/789,048, filed on Apr. 15, 2025, provisional application No. 63/672,512, filed on Jul. 17, 2024.

(51) Int. Cl.

| | |
|---|---|
| ***G05B 19/418*** | (2006.01) |
| ***G06Q 10/20*** | (2023.01) |
| *G05D 105/45* | (2024.01) |
| *H10P 72/30* | (2026.01) |

(52) U.S. Cl.

CPC ....... *G06Q 10/20* (2013.01); *G05B 19/41895* (2013.01); *G05B 2219/32232* (2013.01); *G05B 2219/32249* (2013.01); *G05D 2105/45* (2024.01); *H10P 72/3214* (2026.01); *Y02P 90/02* (2015.11)

(58) Field of Classification Search

CPC .............. G06Q 10/20; G05B 19/41895; G05B 2219/32232; G05B 2219/32249; G05D 2105/45; H01L 21/67724; Y02P 90/02

See application file for complete search history.

(56) References Cited

U.S. PATENT DOCUMENTS

| | | | |
|---|---|---|---|
| 6,622,271 | B1 | 9/2003 | Colby et al. |
| 8,965,561 | B2 | 2/2015 | Jacobus et al. |
| 10,913,606 | B2 | 2/2021 | Eckman et al. |

(Continued)

FOREIGN PATENT DOCUMENTS

| | | | | |
|---|---|---|---|---|
| CN | 103473644 A | * | 12/2013 | |
| WO | WO-2025184739 A1 | * | 9/2025 | ......... G06Q 30/0623 |

OTHER PUBLICATIONS

Shang, Wei; English translation of CN-103473644-A, published 2013 (Year: 2013).*

International Search Report and Written Opinion for Patent Cooperation Treaty Application No. PCT/US2025/037899, dated Aug. 26, 2025, 10 pages.

(Continued)

*Primary Examiner* — Jonathan Michael Skrzycki

(74) *Attorney, Agent, or Firm* — Alston & Bird LLP

(57) ABSTRACT

Various embodiments of the present disclosure provide an automated platform handling facility that leverages a robotic transportation device that is mobile and unmanned to individually transport, inspect, and repair a platform. The robotic transportation device may place a platform on its edge and move the platform from station to station based on individual inspections at each station. Each inspection may specify another station within the automated platform handling facility based on the current state of the platform. In this way, a platform may be moved between stations in a non-sequential, modular, and adaptive manner.

19 Claims, 14 Drawing Sheets

(56) References Cited

U.S. PATENT DOCUMENTS

| | | | | |
|---|---|---|---|---|
| 10,984,378 | B1 | 4/2021 | Eckman et al. | |
| 11,345,577 | B2 | 5/2022 | Holwell et al. | |
| 11,565,420 | B2 | 1/2023 | Grundfest et al. | |
| 11,718,472 | B2 | 8/2023 | Cheng et al. | |
| 2004/0181763 | A1 | 9/2004 | Soltis, Jr. et al. | |
| 2006/0242820 | A1* | 11/2006 | Townsend | G06T 7/521 29/703 |
| 2007/0143979 | A1* | 6/2007 | Townsend | G05B 19/05 29/772 |
| 2009/0169353 | A1* | 7/2009 | Townsend | B23P 19/041 414/222.11 |
| 2015/0105892 | A1* | 4/2015 | Townsend | B23P 19/041 700/98 |
| 2018/0277235 | A1 | 9/2018 | Pingle et al. | |
| 2020/0223066 | A1* | 7/2020 | Diankov | G06Q 10/087 |
| 2020/0316786 | A1* | 10/2020 | Galluzzo | B25J 11/008 |
| 2021/0133666 | A1* | 5/2021 | Eckman | G06T 7/62 |
| 2022/0397912 | A1 | 12/2022 | Franey et al. | |

OTHER PUBLICATIONS

Baird, Renardo, "An Autonomous Forklift Research Platform for Warehouse Operations", Sep. 2018, (46 pages), https://dspace.mit.edu/bitstream/handle/1721.1/121621/1098045700MIT.pdf?isAllowed=y&sequence=1.

Li, et al., "Pallet Detection and Localization with RGB Image and Depth Data Using Deep Learning Techniques", *2021 6th International Conference on Automation, Control and Robotics Engineering*, pp. 306-310, Jul. 15, 2021.

Syu, et al., "A Computer Vision Assisted System for Autonomous Forklift Vehicles in Real Factory Environment", *Multimed Tools Appl*, vol. 76, p. 18387-18407, Published Online Nov. 23, 2016.

Hussain, et al., "Moving Toward Smart Manufacturing with an Autonomous Pallet Racking Inspection System Based on MobileNetV2", *Journal of Manufacturing and Materials Processing*, vol. 6, No. 75, Jul. 8, 2022, (17 pages).

Giner, et al., "A Computer Vision Based Approach to Reduce System Downtimes in an Automated High-Rack Logistics Warehouse", *ScienceDirect*, vol. 118, pp. 1078-1083, (2023).

* cited by examiner

600

1000

1100

1300

1450

1400

AUTOMATED PLATFORM HANDLING SOLUTION

CROSS-REFERENCE TO RELATED APPLICATIONS

This application claims the benefit of U.S. Provisional Application No. 63/672,512, filed Jul. 17, 2024, and U.S. Provisional Application No. 63/789,048, filed Apr. 15, 2025, the entire contents of which are herein incorporated by reference.

TECHNICAL FIELD

The present disclosure relates to the field of platforms, and more particularly, to techniques, processes, and facilities for handling platforms.

BACKGROUND

Traditional platforms, such as structural platforms, include one or more layers of assembled structural components (e.g., deck boards, connector boards, etc.). Each of these components, and the entire platform structure, have an anticipated service cycle that informs an expected time period between platform inspections and repair. Over time, a platform is weakened and damaged in various ways that are dependent on the unique circumstances and the journey of the platform in between service cycles. The diverse array of circumstances and platform journeys complicate the inspection and repair process and prevent the automation of several repair solutions. Repair solutions that do exist, for example, leverage conveyors that obfuscate a part and/or entire side of a platform during transport and may be limited to a singular flow regardless of the repairs needed. Such solutions are inefficient, have limited throughout, and lack the flexibility, modularity, and adaptability to efficiently process platforms on an individualized basis.

BRIEF SUMMARY

Some embodiments of the present disclosure provide an automated platform handling method comprising receiving, at platform inspection facility, a plurality of platforms; initiating, using an inspection system of the platform inspection facility, a universal inspection subtask to generate an initial sensor-based compliance score for a platform of the plurality of platforms; routing, using a robotic transportation device of the platform inspection facility, the platform to a first modular repair station of a plurality of modular repair stations of the platform inspection facility; initiating, using a first modular repair system corresponding to the first modular repair station, a repair subtask for the platform; routing, using the robotic transportation device, the platform to a second modular repair station of the plurality of modular repair stations based on the repair subtask; and verify, using a second modular repair system corresponding to the second modular repair station, a condition of the platform.

In some examples, the inspection system comprises a sensor system configured to generate one or more inspection images of the platform and an inspection module configured to generate the initial sensor-based compliance score based on the one or more inspection images.

In some examples, the initial sensor-based compliance score comprises a percentage value that identifies a predicted level of repair to rehabilitate the platform.

In some examples, the automated platform handling method further comprises identifying the first modular repair station based on a comparison between the initial sensor-based compliance score and a plurality of repair subtask thresholds.

In some examples, the automated platform handling method further comprises determining an unrecoverability determination for the platform based on a comparison between the initial sensor-based compliance score and an unrecoverability threshold; and in response to the unrecoverability determination, routing the platform to a manual intervention station.

In some examples, the first modular repair system comprises a sensor system configured to generate one or more subsequent inspection images of the platform, and an inspection module configured to generate a subsequent sensor-based compliance score based on the one or more subsequent inspection images.

In some examples, initiating the repair subtask comprises initiating, based on the one or more subsequent inspection images, one or more repair operations to modify the condition of the platform; generating one or more terminating inspection images of the platform; and generating a terminating sensor-based compliance score based on the one or more terminating inspection images.

In some examples, routing the platform to the second station based on the repair subtask comprises identifying the second modular repair station based on a comparison between the terminating sensor-based compliance score and a plurality of repair subtask thresholds.

In some examples, the plurality of modular repair stations is associated with a hierarchical repair subtask scheme that defines an order of a plurality of repair tasks, and each of the plurality of modular repair stations correspond to one of the plurality of repair tasks.

In some examples, the platform inspection facility is associated with a routing layout that defines one or more travel paths between the inspection system and the plurality of modular repair stations.

In some examples, the one or more travel paths are defined by a plurality of geofences or a plurality of directional movements.

In some examples, the robotic transportation device comprises an autonomous mobile robot that comprises a vision system, one or more arms, and one or more end effectors.

In some examples, the robotic transportation device autonomously navigates within the platform inspection facility using simultaneous localization and mapping.

In some examples, the robotic transportation device is configured to translate and rotate the platform, via the one or more arms, with a plurality of degrees of freedom.

In some embodiments, a system is disclosed. The system comprises an inspection system; a robotic transportation device; a first modular repair system; second modular repair system; and a management system comprising one or more processors; and one or more memories storing processor-executable instructions that, when executed by the one or more processors, cause the one or more processors to perform operations. The operations comprise receiving, at a platform inspection facility, a plurality of platforms; initiating, using the inspection system of the platform inspection facility, a universal inspection subtask to generate an initial sensor-based compliance score for a platform of the plurality of platforms; routing, using the robotic transportation device of the platform inspection facility, the platform to a first modular repair station of a plurality of modular repair stations of the platform inspection facility; initiating, using the first modular repair system corresponding to the first modular repair station, a repair subtask for the platform; routing, using the robotic transportation device, the platform to a second modular repair station of the plurality of modular repair stations based on the repair subtask; and verifying, using the second modular repair system corresponding to the second modular repair station, a condition of the platform.

In some examples, the robotic transportation device comprises an autonomous mobile robot that comprises a vision system, one or more arms, and one or more end effectors.

In some examples, (i) the plurality of modular repair stations is associated with a hierarchical repair subtask scheme that defines an order of a plurality of repair tasks, and (ii) each of the plurality of modular repair stations correspond to one of the plurality of repair tasks.

In some examples, the inspection system comprises a sensor system configured to generate one or more inspection images of the platform and an inspection module configured to generate the initial sensor-based compliance score based on the one or more inspection images.

In some embodiments, one or more non-transitory computer-readable media stores processor-executable instructions that, when executed by one or more processors, cause the one or more processors to perform operations comprising receiving, at a platform inspection facility, a plurality of platforms; initiating, using an inspection system of the platform inspection facility, a universal inspection subtask to generate an initial sensor-based compliance score for a platform of the plurality of platforms; routing, using a robotic transportation device of the platform inspection facility, the platform to a first modular repair station of a plurality of modular repair stations of the platform inspection facility; initiating, using a first modular repair system corresponding to the first modular repair station, a repair subtask for the platform; routing, using the robotic transportation device, the platform to a second modular repair station of the plurality of modular repair stations based on the repair subtask; and verifying, using a second modular repair system corresponding to the second modular repair station, a condition of the platform.

In some examples, the first modular repair system comprises a sensor system configured to generate one or more subsequent inspection images of the platform, and an inspection module configured to generate a subsequent sensor-based compliance score based on the one or more subsequent inspection images, and the operations further comprise initiating, based on the one or more subsequent inspection images, one or more repair operations to modify the condition of the platform; generating one or more terminating inspection images of the platform; and generating a terminating sensor-based compliance score based on the one or more terminating inspection images.

DETAILED DESCRIPTION

Figure 1:
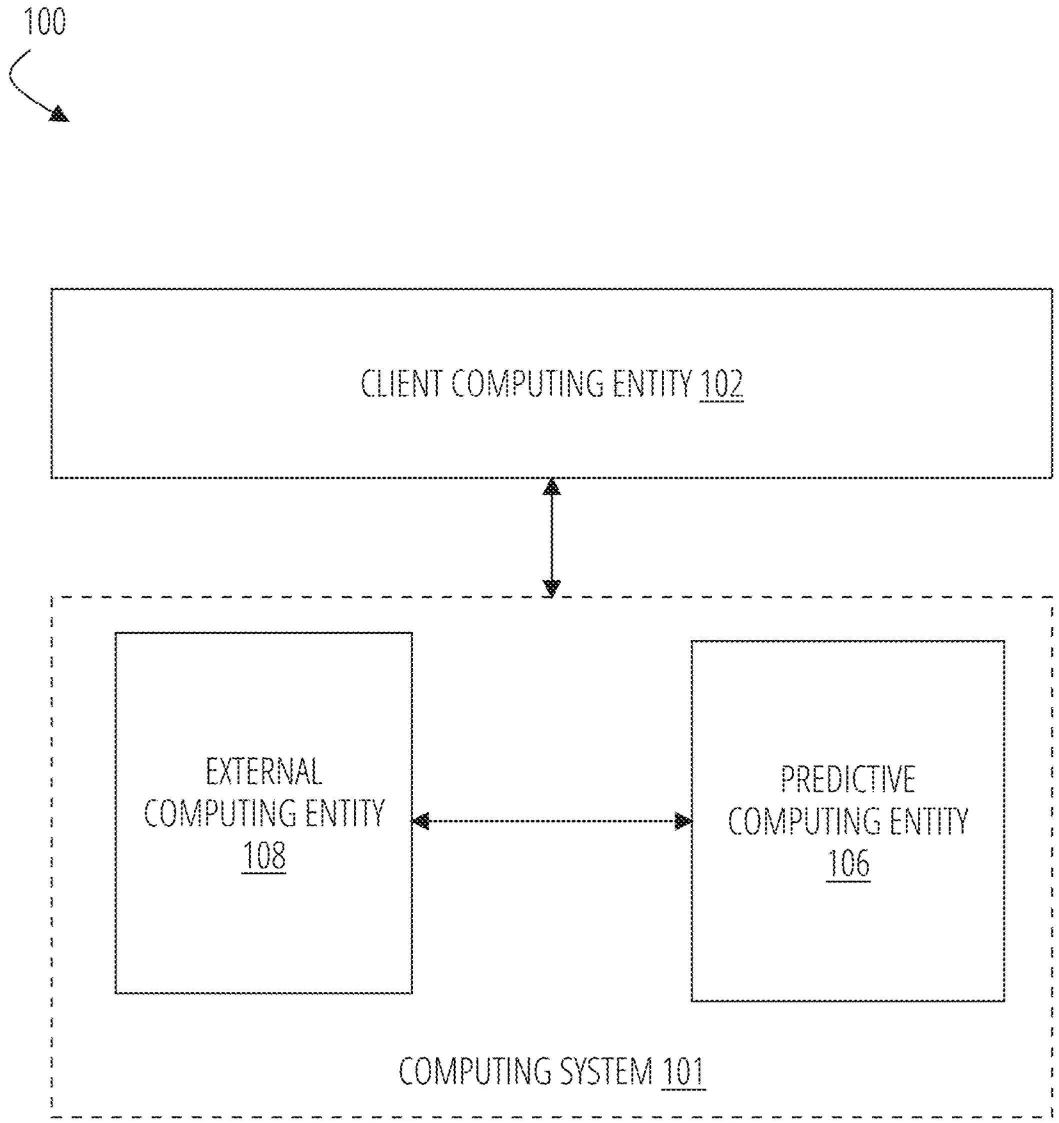
FIG. 1 is an example overview of an architecture in accordance with some embodiments of the present disclosure.

Various embodiments of the present disclosure are described more fully hereinafter with reference to the accompanying drawings, in which some, but not all embodiments of the present disclosure are shown. Indeed, the present disclosure may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "example" are used to be examples with no indication of quality level. Terms such as "computing," "determining," "generating," and/or similar words are used herein interchangeably to refer to the creation, modification, or identification of data. Further, "based on," "based at least in part on," "based at least on," "based upon," and/or similar words are used herein interchangeably in an open-ended manner such that they do not necessarily indicate being based only on or based solely on the referenced element or elements unless so indicated. Like numbers refer to like elements throughout.

I. COMPUTER PROGRAM PRODUCTS, METHODS, AND COMPUTING ENTITIES

Embodiments of the present disclosure may be implemented in various ways, including as computer program products that comprise articles of manufacture. Such computer program products may include one or more software components including, for example, software objects, methods, data structures, or the like. A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform. Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, and/or a report writing language. In one or more example embodiments, a software component comprising instructions in one of the foregoing examples of programming languages may be executed directly by an operating system or other software component without having to be first transformed into another form. A software component may be stored as a file or other data storage construct. Software components of a similar type or functionally related may be stored together such as, for example, in a particular directory, folder, or library. Software components may be static (e.g., pre-established, or fixed) or dynamic (e.g., created or modified at the time of execution).

A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media include all computer-readable media (including volatile and non-volatile media).

A non-volatile computer-readable storage medium may include a floppy disk, flexible disk, hard disk, solid-state storage (SSS) (e.g., a solid-state drive (SSD), solid-state card (SSC), solid-state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

A volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present disclosure may also be implemented as methods, apparatus, systems, computing devices, computing entities, and/or the like. As such, embodiments of the present disclosure may take the form of an apparatus, system, computing device, computing entity, and/or the like executing instructions stored on a computer-readable storage medium to perform certain steps or operations. Thus, embodiments of the present disclosure may also take the form of an entirely hardware embodiment, an entirely computer program product embodiment, and/or an embodiment that comprises a combination of computer program products and hardware performing certain steps or operations.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments may produce specifically configured machines performing the steps or operations specified in the block diagrams and flowchart illustrations. Accordingly, the block diagrams and flowchart illustrations support various combinations of embodiments for performing the specified instructions, operations, or steps.

II. EXAMPLE FRAMEWORK

FIG. 1 provides an example overview of an architecture 100 in accordance with some embodiments of the present disclosure. The architecture 100 includes a computing system 101 and a plurality of client computing entities 102. The example architecture 100 may be used in a plurality of domains and not limited to any specific application as disclosed herewith. The plurality of domains may include banking, healthcare, industrial, manufacturing, education, retail, technology, to name a few.

In accordance with various embodiments of the present disclosure, one or more evaluation models may be trained to generate compliance scores, adaptable compliance strategies, and/or the like. The models may form ensemble architecture that may be configured to automatically evaluate inspection images to generate model outputs to perform inspection and repair tasks.

In some embodiments, the computing system 101 may communicate with at least one of the client computing entities 102 using one or more communication networks. Examples of communication networks include any wired or wireless communication network including, for example, a wired or wireless local area network (LAN), personal area network (PAN), metropolitan area network (MAN), wide area network (WAN), or the like, as well as any hardware, software, and/or firmware required to implement it (such as, e.g., network routers, and/or the like).

The computing system 101 may include a predictive computing entity 106 and one or more external computing entities 108. The predictive computing entity 106 and/or one or more external computing entities 108 may be individually and/or collectively configured to receive requests from client computing entities 102, process the requests to generate outputs, such as image classifications, classification scores, and/or the like, and provide the generated outputs to the client computing entities 102.

For example, as discussed in further detail herein, the predictive computing entity 106 and/or one or more external computing entities 108 comprise storage subsystems that may be configured to store input data, training data, and/or the like that may be used by the respective computing entities to perform predictive data analysis and/or training operations of the present disclosure. In addition, the storage subsystems may be configured to store model definition data used by the respective computing entities to perform various predictive data analysis and/or training tasks. The storage subsystem may include one or more storage units, such as multiple distributed storage units that are connected through a computer network. Each storage unit in the respective computing entities may store at least one of one or more data assets and/or one or more data about the computed properties of one or more data assets. Moreover, each storage unit in the storage systems may include one or more non-volatile storage or memory media including, but not limited to, hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like.

In some embodiments, the predictive computing entity 106 and/or one or more external computing entities 108 are communicatively coupled using one or more wired and/or wireless communication techniques. The respective computing entities may be specially configured to perform one or more steps/operations of one or more techniques described herein. By way of example, the predictive computing entity 106 may be configured to train, implement, use, update, and evaluate machine learning models in accordance with one or more training and/or inference operations of the present disclosure. In some examples, the external computing entities 108 may be configured to train, implement, use, update, and evaluate machine learning models in accordance with one or more training and/or inference operations of the present disclosure.

In some example embodiments, the predictive computing entity 106 may be configured to receive and/or transmit one or more datasets, objects, and/or the like from and/or to the external computing entities 108 to perform one or more steps/operations of one or more techniques (e.g., inspection techniques, and/or the like) described herein. The external computing entities 108, for example, may include and/or be associated with one or more entities that may be configured to receive, transmit, store, manage, and/or facilitate datasets. The external computing entities 108, for example, may include data sources that may provide such datasets, and/or the like to the predictive computing entity 106 which may leverage the datasets to perform one or more steps/operations of the present disclosure, as described herein. In some examples, the datasets may include status databases, routing databases, and/or the like that may collect data from across a plurality of external computing entities 108 into one or more aggregated datasets. The external computing entities 108, for example, may be associated with one or more data repositories, cloud platforms, compute nodes, organizations, and/or the like, which may be individually and/or collectively leveraged by the predictive computing entity 106 to obtain and aggregate data for a prediction domain.

In some example embodiments, the predictive computing entity 106 may be configured to receive a trained machine learning model trained and subsequently provided by the one or more external computing entities 108. For example, the one or more external computing entities 108 may be configured to perform one or more training steps/operations of the present disclosure to train a machine learning model, as described herein. In such a case, the trained machine learning model may be provided to the predictive computing entity 106, which may leverage the trained machine learning model to perform one or more inference steps/operations of the present disclosure. In some examples, feedback (e.g., evaluation data, ground truth data, etc.) from the use of the machine learning model may be recorded by the predictive computing entity 106. In some examples, the feedback may be provided to the one or more external computing entities 108 to continuously train the machine learning model over time. In some examples, the feedback may be leveraged by the predictive computing entity 106 to continuously train the machine learning model over time. In this manner, the computing system 101 may perform, via one or more combinations of computing entities, one or more prediction, training, and/or any other machine learning-based techniques of the present disclosure.

A. Example Predictive Computing Entity

Figure 2:
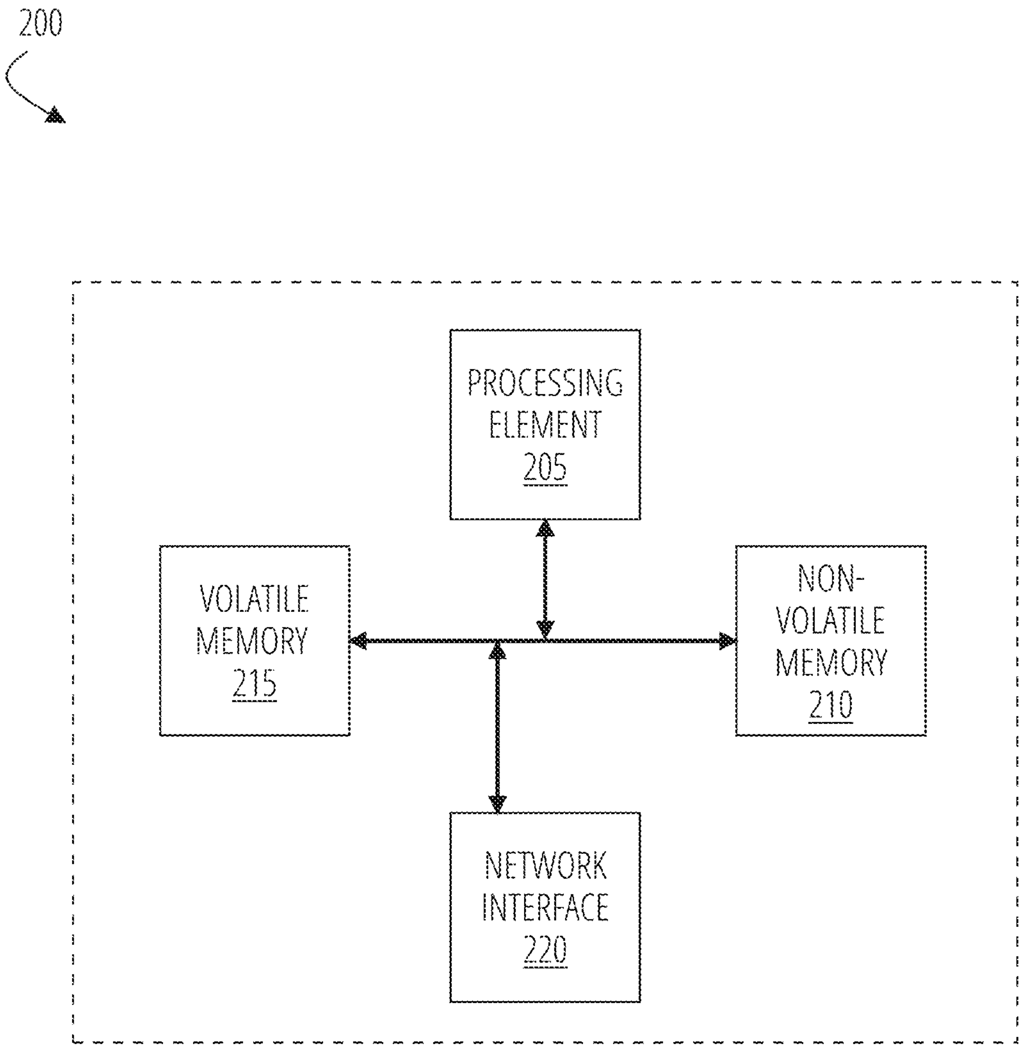
FIG. 2 is an example predictive data analysis computing entity in accordance with some embodiments of the present disclosure.

FIG. 2 provides an example computing entity 200 in accordance with some embodiments of the present disclosure. The computing entity 200 is an example of the predictive computing entity 106 and/or external computing entities 108 of FIG. 1. In general, the terms computing entity, computer, entity, device, system, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, training one or more machine learning models, monitoring, evaluating, comparing, and/or similar terms used herein interchangeably. In some embodiments, these functions, operations, and/or processes may be performed on data, content, information, and/or similar terms used herein interchangeably. In some embodiments, the one computing entity (e.g., predictive computing entity 106, etc.) may train and use one or more machine learning models described herein. In other embodiments, a first computing entity (e.g., predictive computing entity 106, etc.) may use one or more machine learning models that may be trained by a second computing entity (e.g., external computing entity 108) communicatively coupled to the first computing entity. The second computing entity, for example, may train one or more of the machine learning models described herein, and subsequently provide the trained machine learning model(s) (e.g., optimized weights, code sets, etc.) to the first computing entity over a network.

As shown in FIG. 2, in some embodiments, the computing entity 200 may include, or be in communication with, one or more processing elements 205 (also referred to as processors, processing circuitry, and/or similar terms used herein interchangeably) that communicate with other elements within the computing entity 200 via a bus, for example. As will be understood, the processing element 205 may be embodied in a number of different ways.

For example, the processing element 205 may be embodied as one or more complex programmable logic devices (CPLDs), microprocessors, multi-core processors, coprocessing entities, application-specific instruction-set processors (ASIPs), microcontrollers, and/or controllers. Further, the processing element 205 may be embodied as one or more other processing devices or circuitry. The term circuitry may refer to an entirely hardware embodiment or a combination of hardware and computer program products. Thus, the processing element 205 may be embodied as integrated circuits, application specific integrated circuits (ASICs), field programmable gate arrays (FPGAs), programmable logic arrays (PLAs), hardware accelerators, other circuitry, and/or the like.

As will therefore be understood, the processing element 205 may be configured for a particular use or configured to execute instructions stored in volatile or non-volatile media or otherwise accessible to the processing element 205. As such, whether configured by hardware or computer program products, or by a combination thereof, the processing element 205 may be capable of performing steps or operations according to embodiments of the present disclosure when configured accordingly.

In some embodiments, the computing entity 200 may further include, or be in communication with, non-volatile media (also referred to as non-volatile storage, memory, memory storage, memory circuitry, and/or similar terms used herein interchangeably). In some embodiments, the non-volatile media may include one or more non-volatile memory 210, including, but not limited to, hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like.

As will be recognized, the non-volatile media may store databases, database instances, database management systems, data, applications, programs, program modules, scripts, code (e.g., source code, object code, byte code, compiled code, interpreted code, machine code, etc.) that embodies one or more machine learning models or other computer functions described herein, executable instructions, and/or the like. The term database, database instance, database management system, and/or similar terms used herein interchangeably, may refer to a collection of records or data that is stored in a computer-readable storage medium using one or more database models; such as a hierarchical database model, network model, relational model, entity-relationship model, object model, document model, semantic model, graph model, and/or the like.

In some embodiments, the computing entity 200 may further include, or be in communication with, volatile media (also referred to as volatile storage, memory, memory storage, memory circuitry, and/or similar terms used herein interchangeably). In some embodiments, the volatile media may also include one or more volatile memory 215, including, but not limited to, RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like.

As will be recognized, the volatile storage or memory media may be used to store at least portions of the databases, database instances, database management systems, data, applications, programs, program modules, code (source code, object code, byte code, compiled code, interpreted code, machine code) that embodies one or more machine learning models or other computer functions described herein, executable instructions, and/or the like being executed by, for example, the processing element 205. Thus, the databases, database instances, database management systems, data, applications, programs, program modules, code (source code, object code, byte code, compiled code, interpreted code, machine code) that embodies one or more machine learning models or other computer functions described herein, executable instructions, and/or the like may be used to control certain aspects of the operation of the computing entity 200 with the assistance of the processing element 205 and operating system.

As indicated, in some embodiments, the computing entity 200 may also include one or more network interfaces 220 for communicating with various computing entities (e.g., the client computing entity 102, external computing entities, etc.), such as by communicating data, code, content, information, and/or similar terms used herein interchangeably that may be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. In some embodiments, the computing entity 200 communicates with another computing entity for uploading or downloading data or code (e.g., data or code that embodies or is otherwise associated with one or more machine learning models). Similarly, the computing entity 200 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

Although not shown, the computing entity 200 may include, or be in communication with, one or more input elements, such as a keyboard input, a mouse input, a touch screen/display input, motion input, movement input, audio input, pointing device input, joystick input, keypad input, and/or the like. The computing entity 200 may also include, or be in communication with, one or more output elements (not shown), such as audio output, video output, screen/display output, motion output, movement output, and/or the like.

B. Example Client Computing Entity

Figure 3:
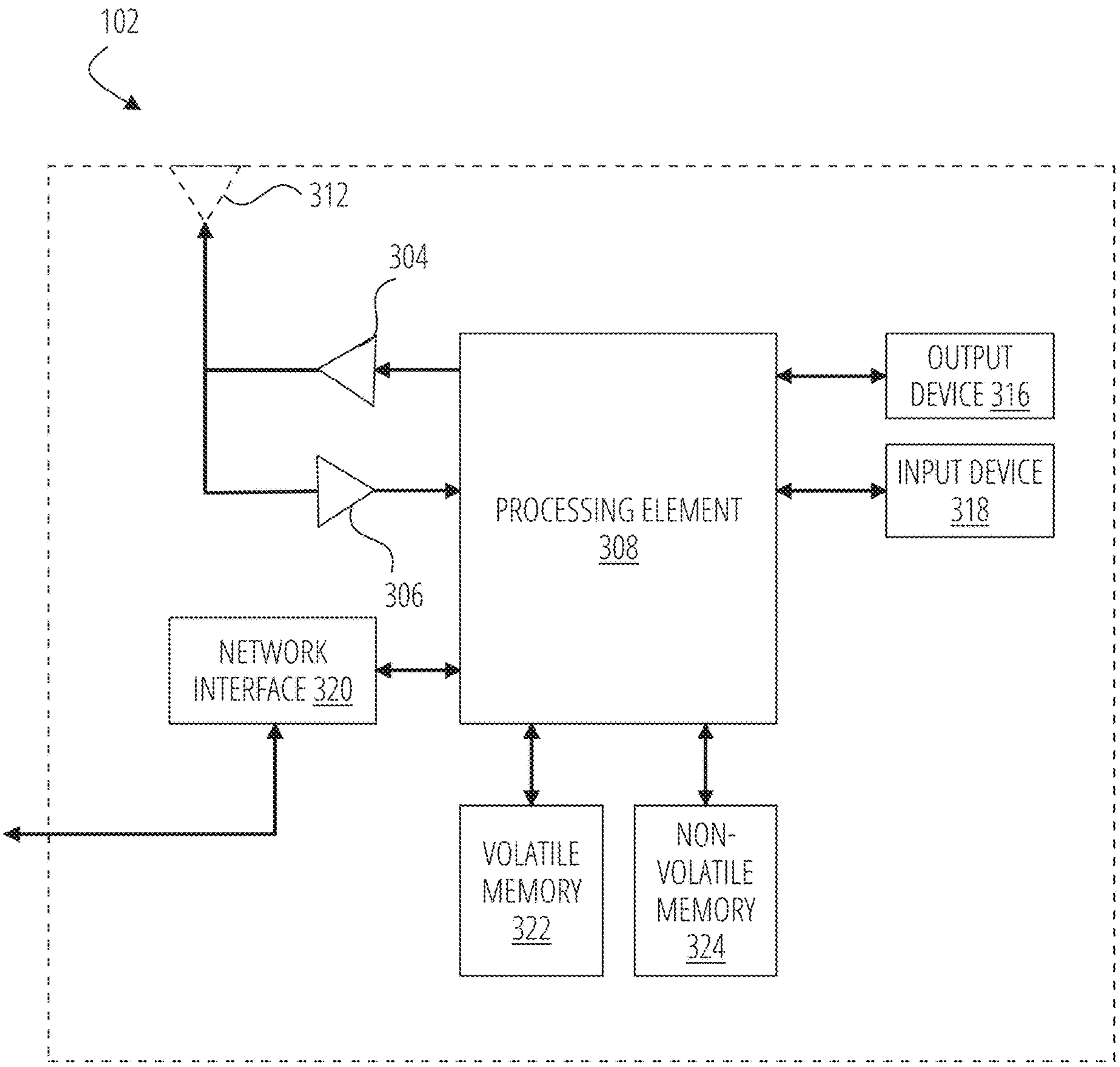
FIG. 3 is an example client computing entity in accordance with some embodiments of the present disclosure.

FIG. 3 provides an example client computing entity in accordance with some embodiments of the present disclosure. In general, the terms device, system, computing entity, entity, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Client computing entities 102 may be operated by various parties. As shown in FIG. 3, the client computing entity 102 may include an antenna 312, a transmitter 304 (e.g., radio), a receiver 306 (e.g., radio), and a processing element 308 (e.g., CPLDs, microprocessors, multi-core processors, coprocessing entities, ASIPs, microcontrollers, and/or controllers) that provides signals to and receives signals from the transmitter 304 and receiver 306, correspondingly.

The signals provided to and received from the transmitter 304 and the receiver 306, correspondingly, may include signaling information/data in accordance with air interface standards of applicable wireless systems. In this regard, the client computing entity 102 may be capable of operating with one or more air interface standards, communication protocols, modulation types, and access types. More particularly, the client computing entity 102 may operate in accordance with any of a number of wireless communication standards and protocols, such as those described above with regard to the computing entity 200. In some embodiments, the client computing entity 102 may operate in accordance with multiple wireless communication standards and protocols, such as UMTS, CDMA2000, 1×RTT, WCDMA, GSM, EDGE, TD-SCDMA, LTE, E-UTRAN, EVDO, HSPA, HSDPA, Wi-Fi, Wi-Fi Direct, WiMAX, UWB, IR, NFC, Bluetooth, USB, and/or the like. Similarly, the client computing entity 102 may operate in accordance with multiple wired communication standards and protocols, such as those described above with regard to the computing entity 200 via a network interface 320.

Via these communication standards and protocols, the client computing entity 102 may communicate with various other entities using mechanisms such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). The client computing entity 102 may also download code, changes, add-ons, and updates, for instance, to its firmware, software (e.g., including executable instructions, applications, program modules), and operating system.

According to some embodiments, the client computing entity 102 may include location determining aspects, devices, modules, functionalities, and/or similar words used herein interchangeably. For example, the client computing entity 102 may include outdoor positioning aspects, such as a location module adapted to acquire, for example, latitude, longitude, altitude, geocode, course, direction, heading, speed, universal time (UTC), date, and/or various other information/data. In some embodiments, the location module may acquire data, sometimes known as ephemeris data, by identifying the number of satellites in view and the relative positions of those satellites (e.g., using global positioning systems (GPS)). The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. This data may be collected using a variety of coordinate systems, such as the DecimalDegrees (DD); Degrees, Minutes, Seconds (DMS); Universal Transverse Mercator (UTM); Universal Polar Stereographic (UPS) coordinate systems; and/or the like. Alternatively, the location information/data may be determined by triangulating the position of the client computing entity 102 in connection with a variety of other systems, including cellular towers, Wi-Fi access points, and/or the like. Similarly, the client computing entity 102 may include indoor positioning aspects, such as a location module adapted to acquire, for example, latitude, longitude, altitude, geocode, course, direction, heading, speed, time, date, and/or various other information/data. Some of the indoor systems may use various position or location technologies including RFID tags, indoor beacons or transmitters, Wi-Fi access points, cellular towers, nearby computing devices (e.g., smartphones, laptops), and/or the like. For instance, such technologies may include the iBeacons, Gimbal proximity beacons, Bluetooth Low Energy (BLE) transmitters, NFC transmitters, and/or the like. These indoor positioning aspects may be used in a variety of settings to determine the location of someone or something within inches or centimeters.

The client computing entity 102 may also comprise a user interface (that may include an output device 316 (e.g., display, speaker, tactile instrument, etc.) coupled to a processing element 308) and/or a user input interface (coupled to a processing element 308). For example, the user interface may be a user application, browser, user interface, and/or similar words used herein interchangeably executing on and/or accessible via the client computing entity 102 to interact with and/or cause display of information/data from the computing entity 200, as described herein. The user input interface may comprise any of a plurality of input devices 318 (or interfaces) allowing the client computing entity 102 to receive code and/or data, such as a keypad (hard or soft), a touch display, voice/speech or motion interfaces, or other input device. In some embodiments including a keypad, the keypad may include (or cause display of) the conventional numeric (0-9) and related keys (#, *), and other keys used for operating the client computing entity 102 and may include a full set of alphabetic keys or set of keys that may be activated to provide a full set of alphanumeric keys. In addition to providing input, the user input interface may be used, for example, to activate or deactivate certain functions, such as screen savers and/or sleep modes.

The client computing entity 102 may also include volatile memory 322 and/or non-volatile memory 324, which may be embedded and/or may be removable. For example, the non-volatile memory 324 may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory 322 may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile memory may store databases, database instances, database management systems, data, applications, programs, program modules, scripts, code (source code, object code, byte code, compiled code, interpreted code, machine code, etc.) that embodies one or more machine learning models or other computer functions described herein, executable instructions, and/or the like to implement the functions of the client computing entity 102. As indicated, this may include a user application that is resident on the client computing entity 102 or accessible through a browser or other user interface for communicating with the computing entity 200 and/or various other computing entities.

In another embodiment, the client computing entity 102 may include one or more components or functionalities that are the same or similar to those of the computing entity 200, as described in greater detail above. In one such embodiment, the client computing entity 102 downloads, e.g., via network interface 320, code embodying machine learning model(s) from the computing entity 200 so that the client computing entity 102 may run a local instance of the machine learning model(s). As will be recognized, these architectures and descriptions are provided for example purposes only and are not limited to the various embodiments.

In various embodiments, the client computing entity 102 may be embodied as an artificial intelligence (AI) computing entity, such as an Amazon Echo, Amazon Echo Dot, Amazon Show, Google Home, and/or the like. Accordingly, the client computing entity 102 may be configured to provide and/or receive information/data from a user via an input/output mechanism, such as a display, a camera, a speaker, a voice-activated input, and/or the like. In certain embodiments, an AI computing entity may comprise one or more predefined and executable program algorithms stored within an onboard memory storage module, and/or accessible over a network. In various embodiments, the AI computing entity may be configured to retrieve and/or execute one or more of the predefined program algorithms upon the occurrence of a predefined trigger event.

III. PLATFORM HANDLING FACILITY

Figure 4:
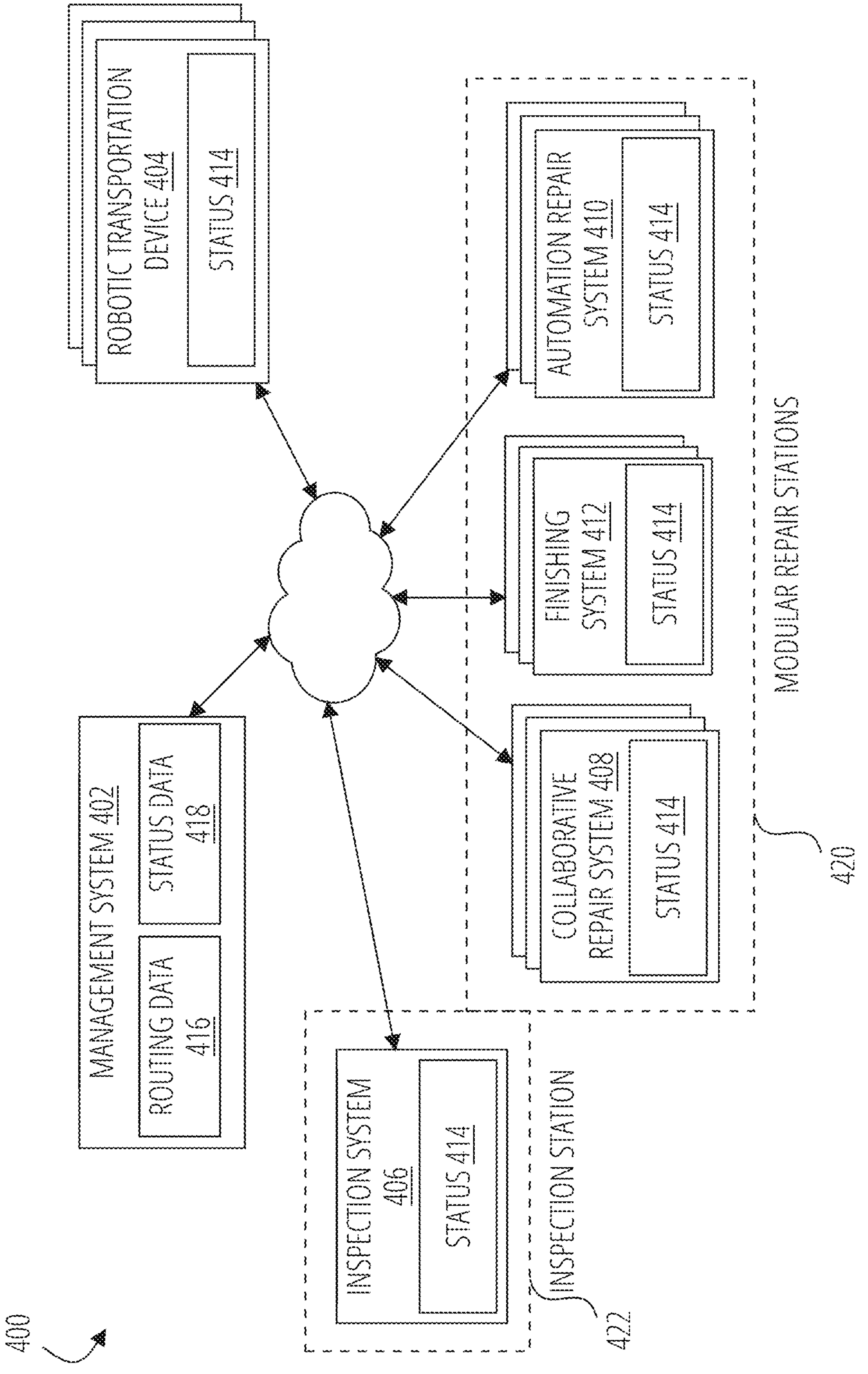
FIG. 4 is an example computing ecosystem showing example computing systems of an automated platform handling facility in accordance with some embodiments discussed herein.

FIG. 4 is an example computing ecosystem 400 showing example computing systems of an automated platform handling facility in accordance with some embodiments discussed herein. The computing ecosystem 400 includes a management system 402, a plurality of robotic transportation devices 404, an inspection station 422, and a plurality of modular repair stations 420. The inspection station 422 and the plurality of modular repair stations 420 may be physically disposed at one or more different locations within the platform handling facility. Each of the stations may be associated with a service computing system. The service computing systems may include an inspection system 406, one or more collaborative repair systems 408, one or more finishing systems 412, and/or one or more automation repair systems 410. Each of the computing systems may communicate over one or more networks to facilitate a semi to fully-automated platform handling process that is asynchronous, flexible, modular, scalable, discrete, and integrated.

In some embodiments, a platform inspection facility is a physical location that stores and services platforms. A platform facility may include a bulk storage and processing facility that is designed to process platforms at a high rate (e.g., 120 per minute, etc.). To do so, the platform inspection facility may include a plurality of semi- to fully-automated processing stations that respectively include a computing system of the computing ecosystem 400. The plurality of semi- to fully-automated processing stations may be strategically placed at various locations of the platform inspection facility to optimize the facility's throughput.

A platform inspection facility is designed to exert positive control over a platform during an inspection process. Positive control, for example, may be established by exerting a force on each platform that controls the movement of the platforms in any direction. This may be accomplished by replacing traditional conveyor based transportation systems with robotic transportation devices 404.

In some embodiments, the robotic transportation device 404 is a mobile, unmanned, platform transportation device. The robotic transportation device 404 may include an autonomous mobile robot (AMR) with one or more legs, arms, and/or the like that are collectively configured to hold and transport a platform from a first location to a second location of a platform inspection facility. The robotic transportation device 404 may identify, positively-control, transport, and deliver (drops off/picks up) individual platforms flexibly and independently throughout a semi- to fully-automated platform handling process.

The legs, for example, may include one or more (e.g., two, three, etc.) wheels, tracks, and/or moveable platforms that may be actuated to move the robotic transportation device 404 in one of a plurality of directions. In some examples, the robotic transportation device 404 may have a zero turning radius. In some examples, the robotic transportation device 404 may constantly move to balance in an upright position based on the principle of an inverted pendulum. By way of example, the robotic transportation device 404 may include an evoBOT®.

The arms may include one or more end effectors. The end effectors may include one or more attachment mechanisms, such as one or more mechanical grippers, vacuum grippers, magnetic grippers, servo grippers, and/or the like. In some examples, the end effectors may be modifiable and the robotic transportation device 404 may the ability to quickly change end effectors in real time. The arms and/or end effectors may be designed to allow the robotic transportation device 404 to translate and rotate a platform with multiple degrees of freedom (roll, lift, tip, rotate, spin). In this manner, the robotic transportation device 404 may be configured to translate and rotate a platform, via the one or more arms, with a plurality of degrees of freedom.

In some examples, the robotic transportation device 404 may include a vision system that comprises one or more cameras, proximity sensors, force/torque sensors, light sensors, magnetic sensors, range sensors, and/or the like. The robotic transportation device 404 may leverage the vision system to autonomously navigate within the platform inspection facility. In some examples, the robotic transportation device 404 may autonomously navigate using simultaneous localization and mapping (SLAM) technology. The robotic transportation device 404 may leverage the vision system to determine a current location, identify a location of a platform, generate a pickup and hold strategy based on the placement of the platform, generate a routing strategy for transporting the platform to a selected station within the platform inspection facility, and execute the routing strategy.

In some examples, the robotic transportation device 404 is configured to individually transport a single platform at a time. To do so, the robotic transportation device 404 may stand the platform vertically, upon its edge, to pick up and move the platform without obfuscating any side of the platform. The robotic transportation device 404 may singulate a platform from a group of platforms, place the platform vertically on its edge, and then use SLAM to transport the platform to one of a plurality of stations distributed across the platform inspection facility.

In some examples, the robotic transportation device 404 may communicate with a management system 402 to select a destination for a platform. To do so, the robotic transportation device 404 may receive real-time data transmissions from the management system 402 that include instructions for initiating the efficient and accurate movement of the robotic transportation device 404. In some examples, the robotic transportation device 404 may include one or more tracking mechanisms, such as radio frequency identification (RFID) transponders, and/or the like, that may collect location data for the robotic transportation device 404. The location data, an availability, an assigned task, a platform identifier for a platform being transported, one or more device health states, and/or any other data reflective of the performance of the robotic transportation device 404 may be stored as a device status 414 and provided to the management system 402 to enable real-time tracking by the management system 402.

In some embodiments, the management system 402 is a computing entity that is configured to facilitate a semi- to fully-automated platform handling process for one or more platform inspection facilities. The management system 402 may include one or more processors and memory communicatively connected to the one or more processors. The one or more processors may be configured to perform one or more operations of the present disclosure. For example, the management system 402 may receive routing data 416 and status data 418 from each of the computing systems and devices of the computing ecosystem 400 and store the data in one or more accessible data mechanisms (e.g., look-up tables, graph-based data structures, relational databases, etc.). The management system 402 may leverage the routing data 416 and status data 418 to intelligently route platforms across a platform inspection facility.

The management system 402, for example, may receive routing requests from the robotic transportation devices 404, inspection system 406, collaborative repair systems 408, finishing systems 412, and/or automation repair system 410. A routing request may include location data, a platform identifier, a sensor-based compliance score for the platform, and/or historical data for the platform. The historical data, for example, may include one or more historical sensor-based compliance scores, one or more historical repair subtasks, and/or the like.

The management system 402 may respond to a routing request by providing one or more routing instructions to a robotic transportation device 404. The routing request may include a platform identifier, a routing plan, a destination station, a priority, and/or the like. In some examples, the routing plan may include one or more directional instructions for directing a robotic transportation device 404 from an origin location to the destination location. The directional instructions, for example, may reflect one or more movement zones, a predefined path, and/or the like. In addition, or alternatively, a routing request may identify the location of a destination station and the robotic transportation device 404 may locally generate directional instructions for the moving from the origin location to the destination location.

In some embodiments, a sensor-based compliance score is a data value that describes a relative structural condition of a platform. A sensor-based score, for example, may include a real number, a percentage, a ratio, and/or the like that reflects a level of repair required to place a platform in condition for a next service life cycle. The sensor-based score may be based on sensor data reflective of a condition of the platform. The sensor data, for example, may include image data (e.g., one or more inspection images), weight data, geometric data (e.g., mass, shape alignment, etc.), metrology data (e.g., point cloud measurements, volumetric information, etc.), and/or the like. In some examples, the sensor data may be collected by a sensor system of the inspection station 422, the modulate repair stations 420, and/or the robotic transportation devices 404.

A sensor-based compliance score may be generated, using one or more evaluation models, based on the sensor data. For example, at least a portion of the sensor data may be input to the one or more evaluation models, to receive a sensor-based compliance score. An evaluation model may include any type of model configured, trained, and/or the like to determine a sensor-based score for a platform based on input sensor data (e.g., input images, weight data, geometric data, metrology data, etc.). The evaluation model may include one or more of any type of machine learning model including one or more supervised, unsupervised, semi-supervised, reinforcement learning and/or generative models. In some embodiments, a evaluation model may include multiple models configured to perform one or more different stages of a platform classification process.

In some embodiments, the sensor-based compliance score corresponds to a grade for a platform. For example, one or more components of the computing ecosystem 400 may grade a platform based on the sensor-based compliance score, and/or the data associated therewith. For instance, a platform may be graded based on input images, weight data, volumetric data, geometric data, metrology data, and/or the like.

By way of example, at least a portion of the evaluation model (e.g., a scoring portion, etc.) may include a neural network architecture that is trained using one or more supervised and/or reinforcement learning techniques. In some examples, the scoring portion may be trained using one or more supervisory training techniques (e.g., back propagation of errors, gradient descent optimization, etc.) and a labelled training dataset that includes a plurality of labeled training entries that each include training sensor data and a corresponding condition label. A condition label, for example, may include a training sensor-based compliance score, a binary validation classification, and/or the like.

As another example, at least a portion of the evaluation model (e.g., a strategic portion, etc.) may include a generative model. For example, the strategic portion may include one or more large language models (LLM), generative pre-trained transformers, robotics transformers (RT-1, RT-2, etc.), deep neural networks (GATO), and/or the like. In some examples, the strategic portion may include an embodied multimodal language model (e.g., PaLM-E, PaLI, etc.). In some examples, the strategic portion of the evaluation model may include a machine learning pipeline that may include a sequence of vision transformers, transformer encoders, transformer decoders, and/or the like. The strategic portion of the evaluation model may be trained, through ground truth sequences of actions, to generate an adaptable compliance strategy for a platform based on sensor data and/or a compliance score for the platform. The strategic portion may be trained using various training techniques, including transfer training (e.g., transfer training across a fleet of robotic device and/or stations, etc.), online learning strategies, and/or the like.

In some examples, the evaluation model may be configured to output a compliance score and/or an adaptable compliance strategy for a platform based on the sensor data. For instance, the adaptable compliance strategy may reflect one or more stations (and/or tasks, etc.) within an automated platform handling facility for strategically addressing one or more identified degradations of the platform. The adaptable compliance strategy, for example, may include a dynamic sequence of stations and/or tasks that may be updated after the performance of a task. In this way, the adaptable compliance strategy may adapt, in real time, to changes to a platform's health.

In some examples, the evaluation model may be accessible to each of the systems of the computing ecosystem 400. For example, the inspection system 406, the collaborative repair system 408, the finishing system 412, and/or the automation repair system 410 may locally store an instance of the evaluation model. In addition, or alternatively, the management system 402 may store the evaluation model in a memory accessible to the inspection system 406, the collaborative repair system 408, the finishing system 412, and/or the automation repair system 410. In this manner, a sensor-based compliance score and/or adaptable compliance strategy may be generated by each of the systems of the ecosystem 400. For example, a first sensor-based compliance score and adaptable compliance strategy may be generated by an inspection system 406. Thereafter, station-level, subsequent sensor-based compliance scores may be generated by each of a plurality of modular repair stations 420 after the performance of one or more repair operations. In addition, or alternatively, the adaptable compliance strategy may be updated by each of the plurality of modular repair stations 420 after the performance of one or more repair operations. In this way, a platform may be continuously inspected and redirected across a platform inspection facility until a sensor-based compliance score achieves a validation threshold.

In some embodiments, the inspection system 406 is a computing entity that is configured to perform a universal inspection subtask for a platform. The inspection system 406 may include one or more processors and memory communicatively connected to the one or more processors. The one or more processors may be configured to perform one or more operations of the present disclosure. For example, the inspection system 406 may detect a platform and, in response to the detection of the platform, perform one or more operations of a universal inspection subtask to generate a first sensor-based compliance score for the platform.

In some examples, the inspection system 406 may include a computing system located at an inspection station 422 of a platform inspection facility. The inspection station 422 may include a first stop of a platform handling process in which a universal inspection is performed to generate a first holistic assessment of the platform. From there, instructions May be generated (e.g., by the inspection system 406 and/or management system 402) and transmitted to/from a robotic transportation device 404 to transport the platform to an appropriate modular repair station 420 based on a sensor-based compliance score reflective of the holistic assessment.

The inspection system 406 may include a sensor system configured to generate one or more inspection images of the platform and/or an inspection module configured to generate the sensor-based compliance score (via the machine learning image processing model, etc.) based on the one or more inspection images and/or additional sensor data. The inspection system 406, for example, may perform an automated compliance inspection (ADI) by generating sensor data (e.g., input images, weight data, etc.) for the platform, processing the sensor data with one or more models, and generating an initial sensor-based compliance score for the platform. The initial sensor-based compliance score may be reflective of missing material (e.g., missing wood, nails, etc.), misalignments of existing material, and/or the like that may be summarized by a single score.

In some embodiments, a universal inspection subtask is one or more inspection operations performed during a platform handling process. The universal inspection subtask, for example, may include generating one or more input images and/or additional sensor data, processing the generated data, and generating an initial sensor-based compliance score based on the generated data. The universal inspection operation may result in an initial sensor-based compliance score that identifies a predicted level of repair to rehabilitate the platform. In some examples, a modular repair station may be selected from a plurality of modular repair stations 420 based on a comparison between the sensor-based compliance score and a hierarchical repair subtask scheme. By way of example, a first station may be identified as a starting point of a repair process based on the initial sensor-based compliance score generated by the universal inspection subtask. In this way, a robotic transportation device 404 may be directly routed to one of a plurality of modular repair stations 420 based on the state of the platform at a particular point in time.

In some embodiments, a hierarchical repair subtask scheme is a data entity that correlates sensor-based compliance scores to a plurality of repair subtasks. A hierarchical repair subtask scheme, for example, may define a hierarchical order of a plurality of repair subtasks. The order of the plurality of repair subtasks may be defined based on a severity level of a repair, a complexity of one or more repair operations, a dependency between one or more repair operations (e.g., remove wood before replacing wood, etc.), and/or the like. By way of example, hierarchical repair subtask scheme may include a logical dependency table that defines an ordered sequence of the repair subtasks.

In some examples, the hierarchical repair subtask scheme may define a threshold score range for each of the plurality of repair subtasks. Each threshold score range may define a range of sensor-based compliance scores that correspond to a particular repair subtask. By way of example, a first threshold score range (e.g., 20-30%) may correspond to a severe repair subtask that may be handled by a collaborative repair system 408, a second threshold score range (e.g., 31-70%) may correspond to an automation repair system 410, a third threshold score range (e.g., 71-99%) may correspond to a finishing system 412, and/or the like. In some examples, each of the above threshold scores may be divided further into task-specific ranges that define a range corresponding to each of a plurality of tasks performed by each of the modular repair stations 420. In some examples, a sensor-based compliance score may be compared to the thresholds of the hierarchical repair subtask scheme to select a next repair subtask for a platform.

In some embodiments, a repair subtask is one or more repair operations performed during a platform handling process to improve a condition of a platform. A repair subtask, for example, may be performed by a modular repair station 420 to improve the condition of a platform. By way of example, the one or more repair operations may include material (e.g., wood, plastic, nails, etc.) removal (e.g., cutting, etc.) operations, material alignment operations, material augmentation operations, and/or the like.

In some examples, a repair subtask may include the one or more repair operations followed by a subsequent inspection subtask to reassess the condition of the platform after the one or more repair operations. For example, each modular repair station 420 (and/or a computing system thereof) may include station sensor systems configured to generate one or more initial and/or subsequent station-specific sensor data (e.g., inspection images, etc.) of the platform and a station inspection module configured to generate an initial and/or subsequent station-specific sensor-based compliance score based on the one or more inspection images.

As described herein, in some embodiments, each repair subtask may include one or more rescoring and/or dynamic defect detection operations. The dynamic defect detection operations, for example, may be triggered after a platform satisfies a compliance threshold. The dynamic defect detection operations may include a structural assessment (e.g., load testing, etc.) of the platform designed to detect invisible cracks within the repaired platform structure. In some examples, the dynamic defect detection operations may be locally applied by a plurality of modular repair stations to remove bottlenecks within the automated repair process.

In some embodiments, a modular repair station 420 is a modular, stand-alone, repair station within a platform inspection facility. A modular repair station 420 may be associated with a semi- to fully-automated computing system. Each may be configured to individually perform one or more of a plurality of repair subtasks. For example, the modular repair stations 420 may include next-level stations (e.g., collaborative repair, paint, automation vision 1, 2, n, etc.) that may perform a repair subtask and reroute a platform to next station. In this way, a platform may be routed directly from one station to another station based on the independent insights at each station. By doing so, traditional inspection bottlenecks are removed from a platform inspection facility leading to increased throughput. A platform may be iteratively repaired and reassessed at each modular repair station 420 until a sensor-based compliance score achieves a validation threshold.

FIG. 4 illustrated three types of modular repair stations for example purposes. The modularity and independence of the modular repair stations 420 enable the introduction and/or removal of different (task/multi-task-specific, etc.) numbers of modular repair stations tailored to a particular platform inspection facility.

In some embodiments, the collaborative repair system 408 is a computing system located at a collaborative repair station of a platform inspection facility. The collaborative repair system 408 may include a next-level stop of a platform handling process in which one or more semi-manual repair operations are performed to repair a condition of a platform. A collaborative repair system 408 may be configured to diagnosis (e.g., manually, using a generative model, etc.) complex issues with a platform and perform one or more repair operations. In some examples, the collaborative repair system 408 may include a hybrid manual and/or artificially intelligent process for collaboratively repairing a platform as described in further detail with reference to the operational example 1100 of FIG. 11.

In some embodiments, the automation repair system 410 is a computing system located at an automation repair station of a platform inspection facility. The automation repair system 410 may include a next-level stop of a platform handling process in which one or more automated repair operations are performed to repair a condition of a platform. As described in further detail with reference to FIG. 9, an automation repair system 410 may comprise a specialized, task-specific repair station (e.g., specific to one or more repair subtasks), a generalized, task-agnostic repair station, and/or a maintenance station.

In some embodiments, the finishing system 412 is a computing system located at a finishing station of a platform inspection facility. The finishing system 412 may include a next-level stop of a platform handling process in which one or more automated finishing operations are performed to finalize a repair process of a platform. The finishing system 412 may include an intelligent paint/branding system, a digitalization system, and/or other post repair systems, such as a platform washing system, heat treatment system, and/or the like. As described in further detail with reference to FIG. 9, the paint system may include one or more automated painting and/or stenciling mechanisms (e.g., painting robots, etc.) that may apply paint to a platform in an optimized manner. The digitalization system may include an automated tagging and/or fingerprinting system for adding tracking mechanisms to a platform (e.g., in addition to the painted branding).

An automated tagging system may be configured to robotically attach and/or associate one or more identification tags (e.g., radio-frequency tags, etc.) with the platform. For example, a platform may be tagged at one or more locations of the platform inspection facility by applying a scannable code, such as a barcode, a quick response (QR) code, and/or the like. In some examples, the scannable code may include an RFID code. In addition, or alternatively, a tracking device, such as an RF tracking device that emits an RF signature, may be affixed to the platform. By way of example, the tracking device may be manually and/or robotically attached to a block of platform, as illustrated by the operational examples 1400 and 1450 of FIG. 14.

The fingerprinting system may be configured to generate a fingerprint signature for the platform. In some examples, the fingerprinting system may fingerprint a platform by collecting visual and/or other data from the platform. A fingerprint, for example, may include the sensor data that is reflective of a condition of the pallet. In addition, or alternatively, a fingerprint may include a wood grain pattern of at least a portion of the platform. In some examples, the fingerprint may dynamically change during the repair process. To accommodate for these changes, a fingerprint may be generated after each repair process and added to a sequence of fingerprints generated for a particular platform.

In some examples, a platform fingerprint may be leveraged as a platform identifier. The platform identifier, for example, may correspond to a virtual platform data object for the platform. In some examples, the platform data object may include a sequence of fingerprints, repair operations, anticipated repair operations (e.g., routing strategy), and/or like, for a particular platform.

In some embodiments, the routing data 416 is a data structure that describes layout data of a platform inspection facility. For example, a platform inspection facility may be associated with a routing layout that defines one or more travel paths to and between the inspection station 422 and the plurality of modular repair stations 420. The one or more travel paths may be defined by a plurality of geofences and/or a plurality of directional movements. By way of example, the routing data 416 may define a discrete (e.g., coordinates, etc.) and/or relative (relative position, etc.) location for each of the plurality of stations within a platform inspection facility. In addition, or alternatively, the routing data 416 may define a plurality of defined routes, defined movement zones (e.g., restricted movement, permissible movement, etc.), geofences, and/or the like.

By way of example, the platform inspection facility may include a plurality of active and/or passive radio-frequency devices, lasers, and/or the like that may be positioned at one or more locations within the platform inspection facility to establish one or more virtual boundaries for a robotic transportation device. In addition, or alternatively, each of the robotic transportation devices may travel within the platform inspection facility using a virtual map of the facility and real time location data (e.g., GPS, cellular, WiFi data, etc.) of the device. One or more geofences may be virtually drawn with the virtual map to establish one or more geofences within the platform inspection facility.

In some embodiments, the status data 418 is a data structure that describes a current, historical, and/or predicted status for each of the computing entities of the computing ecosystem 400. For example, the status data 418 may include a lookup table that describes a current status 414 for each of the computing entities. A current status 414 may describe a location, an availability (e.g., repair in-progress, enroute, available, etc.), and/or the like for each of the computing entities and/or associated stations.

Figure 5:
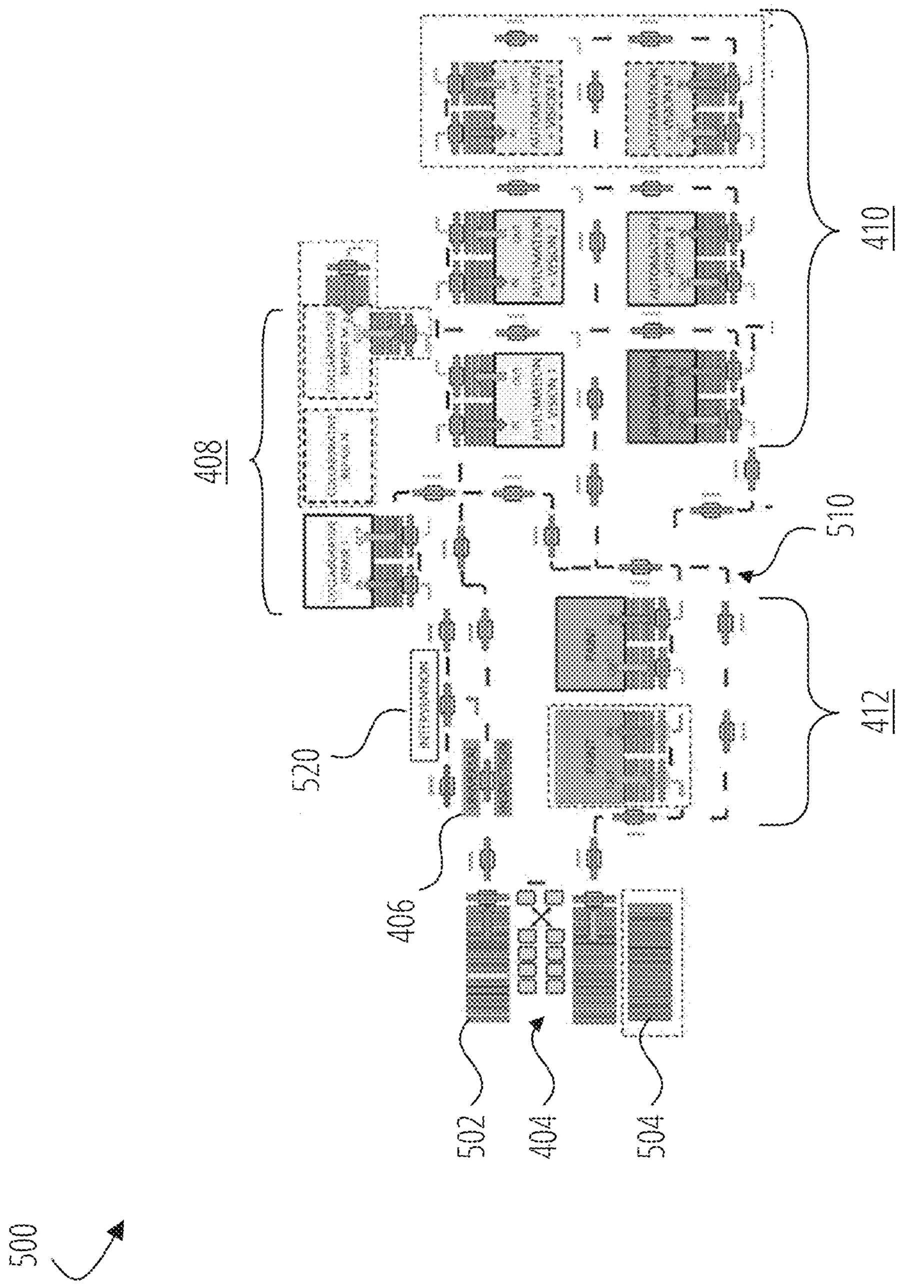
FIG. 5 is an operational example of an automated platform handling facility in accordance with some embodiments discussed herein.

FIG. 5 is an operational example of an automated platform handling facility 500 in accordance with some embodiments discussed herein. As depicted, an automated platform handling facility 500 may include a plurality of stations positioned at various locations across the facility. For instance, the automated platform handling facility 500 may include an ingress point in which a plurality of damaged platforms 502 are stacked for intake. Thereafter, the automated platform handling facility 500 may include an inspection system 406, a plurality of collaborative repair systems 408, a plurality of automation repair systems 410, a plurality of finishing systems 412, and an egress point in which a plurality of repaired platforms 504 are stacked.

At the ingress point, a plurality of damaged platforms 502 may be de-stacked, singulated, and then transported by a robotic transportation device 404 to the inspection system 406. The inspection system 406 may generate an initial sensor-based compliance score reflective of an initial condition of the damaged platform 502. In some examples, the robotic transportation device 404 may leverage machine vision and other contextual data to generate a pick-up location and strategy for transporting the damaged platform 502.

At the inspection system 406, an initial sensor-based compliance score is generated for the damaged platform 502. The initial sensor-based compliance score is used (e.g., with the hierarchical repair subtask scheme) to determine a route for the damaged platform 502. In some examples, an initial sensor-based compliance score may result in an unrecoverability determination for the platform based on a comparison between the sensor-based compliance score and an unrecoverability threshold. In response to the unrecoverability determination, the damaged platform 502 may be routed the platform to a manual intervention station 520 for removal from the repair process.

At each of the modular repair stations, a subsequent sensor-based compliance score is generated for the damaged platform 502 and used (e.g., with the hierarchical repair subtask scheme) to determine a next route for the damaged platform 502. In some examples, each station of the platform inspection facility may include its own independent accumulator input and output platform magazines. Based on the prescribed inspection and automation strategy, the robotic transportation device 404 may re/position damaged platforms 502 to/from the accumulator input and output platform magazines when routing the damaged platforms 502 across the platform inspection facility.

In this manner, a plurality of damaged platforms 502 may be routed between a plurality of modular stations, using a plurality routing paths 510, until a repaired platform 504 is returned to an egress point of the platform inspection facility. In some examples, at a management system level, a chain validation of platform quality may be monitored to manage the full automation journey of a platform.

IV. EXAMPLE SYSTEM OPERATIONS

Figure 6:
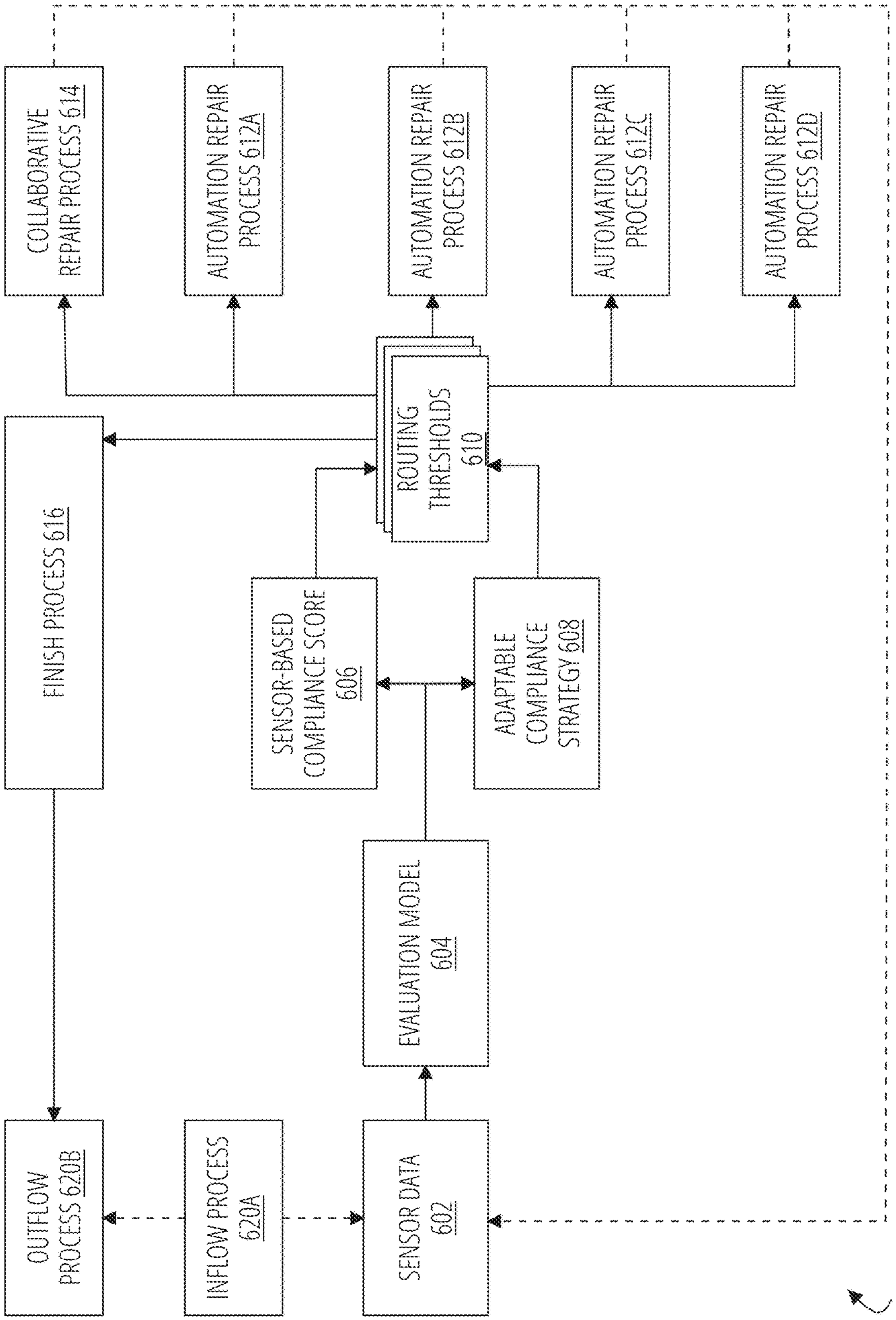
FIG. 6 is a dataflow diagram of an automated platform handling process in accordance with some embodiments discussed herein.

FIG. 6 is a dataflow diagram of an automated platform handling process 600 in accordance with some embodiments discussed herein. The dataflow diagram depicts a multi-task, asynchronous, and automated process 600 for tailoring repair operations to a particular platform based on the specific circumstances of the platform. To do so, the process 600 may include a plurality of iterative and asynchronous evaluate, repair, and reassess (ERR) tasks that may be independently applied by a plurality of connected systems within a platform inspection facility. By doing so, the automated platform handling process 600 provides a modular, scalable, and flexible approach for handling platforms as scale.

In some embodiments, the process 600 begins at an inflow process 620A of the platform inspection facility, where a platform is selected, preprocessed, and singulated (e.g., through a vertical stack) within a singulated platform queue for further processing. In some examples, each platform may be preprocessed at the inflow process 620A to remove debris, protrusions, and/or obfuscation from the platform structure. In some examples, the cleaned platform may be initially analyzed to detect a platform type and filter inbound platforms based on a match between the detected platform type and platform inspection facility criteria. This ensures that foreign platforms are rerouted from the platform inspection facility during the inflow process 620A of the platform inspection facility before the platform is fully processed. The inflow process 620A, for example, may be described in further detail with reference to FIG. 9.

After the inflow process 620A, sensor data 602 may be generated for a platform selected from a singulated queue. The sensor data 602 may be generated by a sensor system at one of an inspection system and/or a plurality of collaborative and/or automation repair systems. For instance, the sensor data 602 may be initially generated by an inspection system to generate an initial sensor-based compliance score. Thereafter, the sensor data 602 may be iteratively regenerated by one of a plurality of modular repair stations (and/or a robotic transportation device) as one or more repair subtasks are performed.

The sensor data 602 may be input to an evaluation model 604 to generate a sensor-based compliance score 606 and/or adaptable compliance strategy 608. In some examples, the sensor-based compliance score 606 and/or the adaptable compliance strategy 608 may be applied to one or more routing thresholds 610 to determine a repair subprocess for the platform. For example, a repair subprocess may include the collaborative repair process 614 when the sensor-based compliance score 606 is less than 60%. In some examples, the repair subprocess may include a first automation repair process 612A when the sensor-based compliance score 606 is between 60-70%. The repair subprocess may include a second automation repair process 612B when the sensor-based compliance score 606 is between 70-80%. The repair subprocess may include a third automation repair process 612C when the sensor-based compliance score 606 is between 80-90%. The repair subprocess may include a fourth automation repair process 612D when the sensor-based compliance score 606 is above 90%. In some examples, the routing thresholds 610 may be applied with the adaptable compliance strategy 608 to strategically route a platform among a plurality modular repair stations within the platform inspection facility.

In some examples, the sensor-based compliance score 606 may correspond to a non-compliance rate detected. After each repair subtask, the respective modular repair station may regenerate the sensor data 602 and, using the evaluation model 604, rescore the platform. In the event that a sensor-based compliance score 606 satisfies a compliance threshold (e.g., 95%, etc.), the respective modular repair station may perform one or more dynamic defect detection operations to check for one or more hidden abnormalities (e.g., invisible cracks, etc.). In the event that the platform passes the dynamic defect detection operations, the platform may be diverted from the iterative asynchronous ERR tasks to a finish process 616. During the finish process 616, the platform may be painted, etched, tagged, and/or fingerprinted before it is passed to the outflow 620B process and exits the platform inspection facility.

Figure 7:
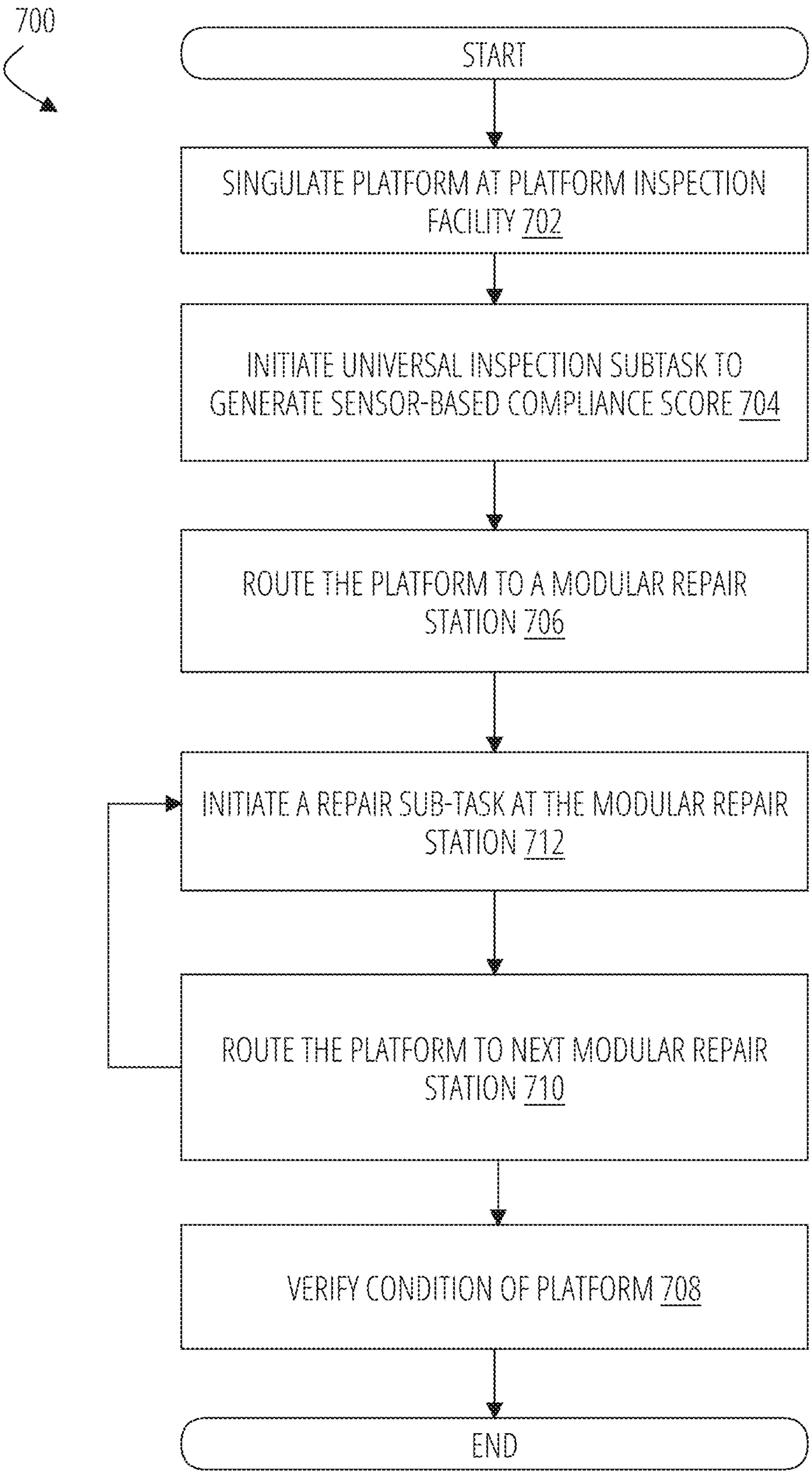
FIG. 7 is a flowchart diagram of an automated platform handling facility in accordance with some embodiments discussed herein.

FIG. 7 is a flowchart diagram of an automated platform handling process 700 in accordance with some embodiments discussed herein. The flowchart depicts an automated process 700 for handling platforms in bulk that specifically addresses throughput constraints that traditionally limit the efficiencies of platform repurposing. The process 700 may be implemented by one or more computing devices, entities, and/or systems described herein. For example, via the various steps/operations of the process 700, computing system 101 may leverage a computing ecosystem, as described herein, to automate a traditionally manual platform handling process. By doing so, the automated platform handling process 700 facilitates techniques that specifically address challenges unique to inspection-laden repair procedures. Ultimately, this allows for the increased modularity, flexibility, adaptability, and throughput in a platform handling process that may be applied to a plurality of different fields, including mechanical repairs of any nature (e.g., vehicle, consumer devices, etc.).

FIG. 7 illustrates an example process 700 for explanatory purposes. Although the example process 700 depicts a particular sequence of steps/operations, the sequence may be altered without departing from the scope of the present disclosure. For example, some of the steps/operations depicted may be performed in parallel or in a different sequence that does not materially impact the function of the process 700. In other examples, different components of an example device or system that implements the process 700 may perform functions at substantially the same time or in a specific sequence.

In some embodiments, the process 700 includes, at step/operation 702, singulating a platform at a platform inspection facility. For example, the computing system 101 may singulate, using a robotic transportation device, a platform from a plurality of platforms delivered to a platform inspection facility. The computing system 101, for example, may receive, at the platform inspection facility, a plurality of platforms. A robotic transportation device of a plurality of robotic transportation devices within the platform inspection facility may select one of the plurality of platforms for an inspection and repair process.

In some examples, upon selection, the robotic transportation device may perform one or more intake preprocessing operations to filter a plurality of inbound pallets before they enter a singulated repair queue. To do so, the robotic transportation device may identify a type of platform, using an onboard vision system, and determine whether the platform matches one or more platform inspection facility criteria. The platform inspection facility criteria, for example, may identify one or more eligible and/or ineligible (e.g., foreign platforms, etc.) platform types. In the event that the platform does not match the one or more platform inspection facility criteria, the robotic transportation device may move the platform to an egress point of the platform inspection facility. Otherwise, the robotic transportation device may move the platform to an inspection system.

In some examples, the robotic transportation device may include an AMR that includes a sensor system, one or more arms, and/or one or more end effectors. The robotic transportation device may be configured to translate and rotate the platform, via the one or more arms, with a plurality of degrees of freedom. In some examples, the robotic transportation device may autonomously navigate within the platform inspection facility using SLAM. For instance, the platform inspection facility may be associated with a routing layout that defines one or more travel paths between an inspection system and a plurality of modular repair stations. In some examples, the one or more travel paths may be defined by a plurality of geofences and/or a plurality of directional movements.

In some embodiments, the process 700 includes, at step/operation 704, initiating a universal inspection subtask to generate an initial sensor-based compliance score. For example, the computing system 101 may initiate, using an inspection system of the platform inspection facility, a universal inspection subtask to generate an initial sensor-based compliance score for the particular platform of the plurality of platforms.

In some examples, the inspection system may include a sensor system configured to generate one or more inspection images of the platform. In addition, or alternatively, the inspection system may include an inspection module configured to generate the initial sensor-based compliance score based on the one or more inspection images. The initial sensor-based compliance score may include a percentage value that identifies a predicted level of repair to rehabilitate the platform.

In some embodiments, the process 700 includes, at step/operation 706, routing the platform to a first modular repair station within the platform inspection facility. For example, the computing system 101 may route, using the robotic transportation device, the platform to a first modular repair station of a plurality of modular repair stations within the platform inspection facility based on the initial sensor-based compliance score. In some examples, the computing system 101 may identify the first modular repair station based on a comparison between the initial sensor-based compliance score and a plurality of repair subtask thresholds. For instance, the plurality of modular repair stations may be associated with a hierarchical repair subtask scheme that defines an order of a plurality of repair tasks and/or the plurality of repair subtask thresholds. Each of the plurality of modular repair stations may correspond to one of the plurality of repair tasks. The first modular repair station may be identified based on a correspondence between the initial sensor-based compliance score and one of the plurality of repair subtask thresholds that corresponds to the first modular repair station.

In addition, or alternatively, the computing system 101 may determine an unrecoverability determination for the platform based on a comparison between the initial sensor-based compliance score and an unrecoverability threshold. In response to the unrecoverability determination, the computing system 101 may route the platform to a manual intervention station and the process 700 may end.

In some embodiments, the process 700 includes, at step/operation 708, initiating a repair subtask for the platform at the first modular repair station. For example, the computing system 101 may initiate, using a modular repair system, the repair subtask for the platform at the first modular repair station. For instance, the computing system 101 may initiate, using a modular repair system corresponding to the first modular repair station, the repair subtask for the platform.

The first modular repair system may include a sensor system configured to generate one or more subsequent inspection images of the platform. In addition, or alternatively, the first modular repair system may include an inspection module configured to generate a subsequent sensor-based compliance score based on the one or more subsequent inspection images. In some examples, the first modular repair system may initiate, based on the one or more subsequent inspection images, one or more repair operations to modify the condition of the platform. The first modular repair system may generate one or more terminating inspection images of the platform and generate a terminating sensor-based compliance score based on the one or more terminating inspection images.

In some embodiments, the process 700 includes, at step/operation 710, routing the platform to a second modular repair station within the platform inspection facility. For example, the computing system 101 may route, using the robotic transportation device, the platform to a second modular repair station of the plurality of modular repair stations based on the repair subtask. In some examples, the computing system 101 may identify the second modular repair station based on a comparison between the terminating sensor-based compliance score and the plurality of repair subtask thresholds.

In some examples, the process 700 may return to step/operation 708 to iteratively repair the platform until a stop condition is reached. The stop condition, for example, may include a validation threshold for a sensor-based compliance score. In the event that the stop condition is achieved, the process 700 may continue to step/operation 712.

In some embodiments, the process 700 includes, at step/operation 712, verifying a condition of the platform. For example, the computing system 101 may verify the condition of the platform. For instance, the computing system 101 may verify, using a second modular repair system corresponding to the second modular repair station, the condition of the platform.

Figure 8:
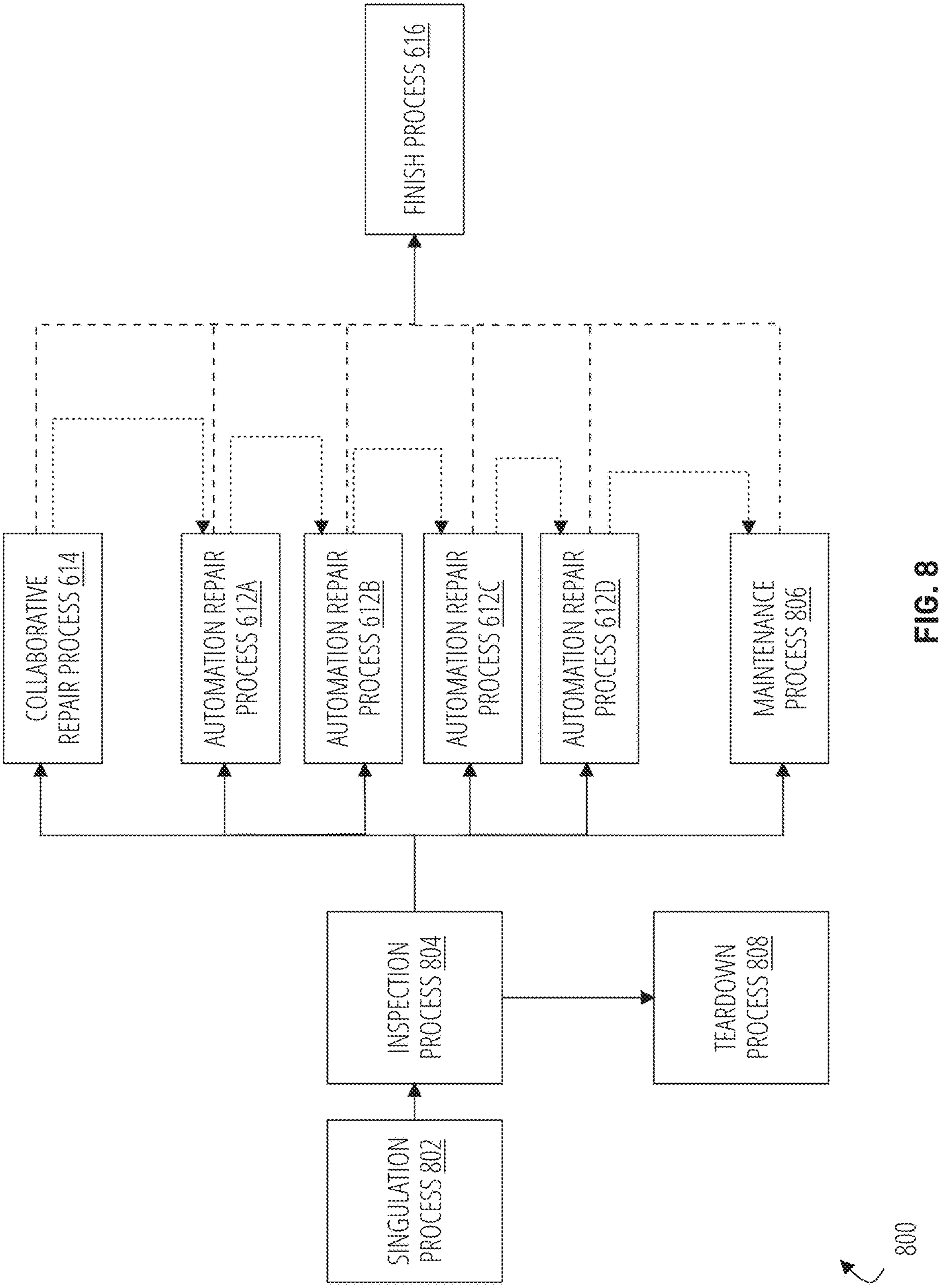
FIG. 8 is a process diagram of one or more throughput optimization strategies for an automated platform handling process in accordance with some embodiments discussed herein.

FIG. 8 is a process diagram of one or more throughput optimization strategies 800 for an automated platform handling process in accordance with some embodiments discussed herein. The dataflow diagram depicts different arrangements of station-specific processes that may be configured to improve the throughput of a multi-task, asynchronous, and automated platform handling process. The different arrangements may comprise a singulation process 802 and an inspection process 804 that are followed by one or more different sequences of collaborative repair processes 614, automation repair processes 612A-D, and/or maintenance processes 806. In some examples, the one or more different sequences may comprise (i) a generalized sequence in which up to each of the automation repair processes 612A-D are performed by generalized automation repair systems configured for up to each of a set of sub-repair tasks, (ii) a specialized sequence in which up to each of the automation repair processes 612A-D are performed by specialized automation repair systems each configured for one or more different specialty subsets of the set of sub-repair tasks, and/or (iii) a hybrid sequence that is performed by a combination of generalized and/or specialized automation repair systems. In some embodiments, the particular arrangements of station-specific processes may be tailored to a platform inspection facility to improve the throughput of the facility based on a frequency and/or diversity of repair sub-tasks performed within the platform inspection facility over time.

Figure 9:
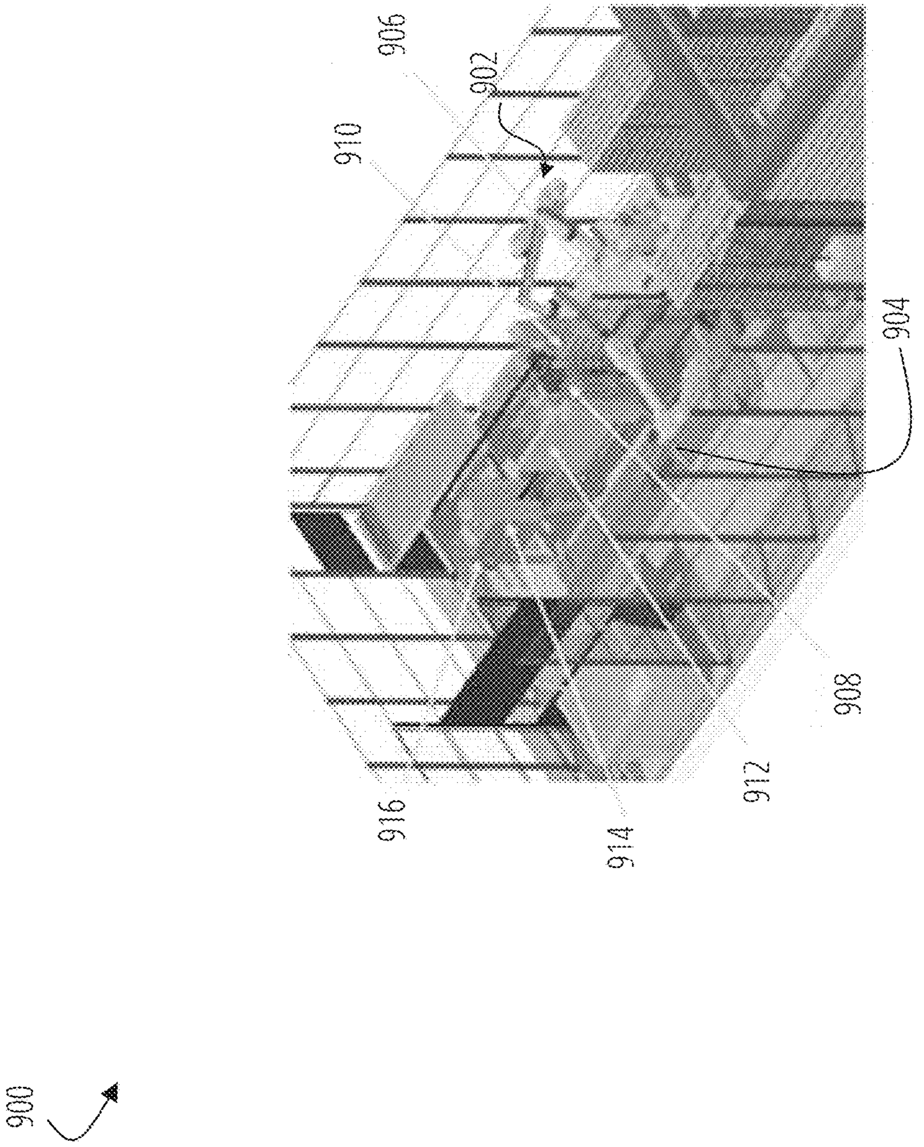
FIG. 9 is an operational example of at least a portion of a singulation system configured for the singulation process in accordance with some embodiments discussed herein.

In some embodiments, a throughput optimization strategy employs an independent singulation process 802 that is configured to intake a set of platforms, remove contaminants, such as plastic wrap and the like from the set of platforms, and singulate a platform from the set of platforms for further processing. The singulation process 802, for example, may be performed by an automated singulation system, as shown in FIG. 9, that is configured to receive a set (e.g., a stack) of platforms and output a singulated platform from the set of platforms.

In some embodiments, the singulation process 802 comprises a set processing subtask configured to remove connecting material, such as plastic or cloth wraps, straps, and/or the like, from a set of platforms to allow for separation of single platform from the set of platforms. The set processing subtask may be performed by a first robotic device of the singulation system that may comprise a vision system, one or more robotic arms (e.g., articulated arms, six-axis arms), a control unit, and/or the like. The control unit may be configured to scan (e.g., using the vision system) a set of platforms to detect (e.g., using one or more image classification techniques of the vision system) connecting material. If undetected, the set of platforms may be pushed (e.g., via the robotic arms, a conveyor assembly) to a subsequent subtask (e.g., an extraction subtask) of the singulation process 802. If connecting material is detected, the control unit may classify (e.g., using a machine learning classification model, such as a convolutional neural network trained on image classification data) the connecting material as one of a set of defined material categories (e.g., plastic wrap, cloth wrap, plastic strap, leather strap, metal attachment). The control unit may determine removal instructions for the robotic arms based on the defined material category identified for the set of platforms and provide the instructions to the one or more robotic arms. The one or more robotic arms may execute the instructions to remove, tear, disconnect, or otherwise separate the connecting material from the set of platforms. Once completed, the set of platforms may be pushed (e.g., via the robotic arms, a conveyor assembly) to a subsequent subtask (e.g., an extraction subtask) of the singulation process 802

In some embodiments, the singulation process 802 comprises an extraction subtask configured to extract a single platform from the set of platforms. The extraction processing subtask may be performed by the first robotic device and/or a second robotic device of the singulation system. The second robotic device that may comprise a vision system, one or more robotic arms (e.g., articulated arms, six-axis arms), a control unit, and/or the like. In some examples, the control unit (e.g., of the first or second robot device) may scan (e.g., using a vision system) a separated (e.g., by removing the connecting material) set of platforms, provide location data (e.g., indicating coordinates of a top portion of the set of platforms) to a robotic arm, and move (e.g., using the robotic arm) at least one platform from the set of platforms to a secondary processing location that is separated from the location of the set of platforms. The secondary processing location, for example, may comprise a conveyor assembly, a staged processing area, and/or the like. In some examples, the separated platform may be placed within the secondary processing location in vertical orientation. The singulation process 802 may then process to a subsequent stage for the separated platform.

In some embodiments, the singulation process 802 comprises a platform processing subtask configured to remove extraneous material, such as residual connecting material, dirt, debris, and/or the like, from a separated platform. The platform processing subtask may be performed by the arrangement of robotic devices of the singulation system. The arrangement of robotic devices, for example, may comprise one or more visions systems, conveyor assemblies (e.g., belt conveyors, chain conveyors, overhead conveyors, flat belt conveyors, modular conveyors, roller conveyors), robotic arms (e.g., articulated arms, six-axis arms), sprayers, brushing mechanism, a control unit, and/or the like. In some examples, the platform processing subtask is configured to receive a singulated platform (e.g., vertically orientated), pass the singulated platform through a set of debris removal devices, and output a cleaned singulated platform. The set of debris removal devices, for example, may comprise a rolling module (e.g., one or more mechanical roller configured to push the platform through set of debris removal devices), a platform topper and wrap removal module (e.g., one or more heater, scraper, and/or other mechanism configured to remove residual connecting material from the platform), a staple removal module (e.g., one or more magnetic and/or mechanical devices configured to scrape, pull, or otherwise remove stables from the surface of a platform), a brushing module (e.g., one or more mechanical cylindrical, wheel-shaped, and cup-shaped brushes powered by motor), a platform rotator module, and/or the like, as shown in the operational example 900 of FIG. 9. In some examples, the cleaned, singulated platform may be initially analyzed to detect a platform type and filter inbound platforms based on a match between the detected platform type and platform inspection facility criteria, as described herein.

In some embodiments, a throughput optimization strategy employes an inspection process 804 that is configured to intake singulated platforms, perform one or more inspection subtasks to determine an initial condition of the platform, store the inspection data within a virtual platform data object associated with the platform, and/or provide the platform for further processing based on the virtual platform data object. In some examples, the one or more inspection subtasks may comprise one or more non-destructive inspection (NDI) operations, such as visual testing, high-energy electromagnetic radiation (e.g., x-ray testing, computed tomography (CT) scanning), ultrasonic testing, vibration analysis, magnetic particle testing, and/or the like. In some examples, the results, and/or portions thereof, from up to each of the inspection subtasks may be aggregated within a single virtual platform data object (e.g., a damage profile) that may be referenced by downstream systems within the platform inspection facility.

In some examples, the NDI operations may be coupled with machine learning processes to transform non-destructive insights, such as x-ray and/or CT scans, into proxies for replacing destructive insights without physical intervention to the platform. The machine learning process may employ a single or ensemble machine learning classier to generate an initial condition prediction for a platform based on imagery (e.g., three-dimensional CT scan data, x-ray data) of the platform.

In the single model approach, a neural network based classifier (e.g., convolutional neural network) may be trained using a labeled dataset to generate a generalized health prediction for the platform. The labeled dataset, for example, may comprise a set of labeled imagery data points that each comprise imagery and a binary label indicative whether the platform corresponding to the imagery complies with one or more quality standards. In some examples, the model may be trained, using backpropagation of errors, to optimize a loss function (e.g., cross-entropy loss) designed to maximize the accuracy of the model with respect to the labels within the labeled dataset. In some examples, the initial condition prediction may comprise a raw, probabilistic value output by the model. In addition, or alternatively, the initial condition prediction may comprise a classification (e.g., subtask classification) that may be determined by applying a set of thresholds (e.g., each mapping a probabilistic range to a subtask) to the raw, probabilistic value output by the model.

In an ensemble model approach, a set of neural network based classifiers (e.g., convolutional neural networks) may be trained using a set of labeled datasets to generate a set of specific defect predictions for the platform. The specific defect predictions, for example, may comprise a prediction with respect to at least one of a crack, split, loose element, missing part and/or component, fastener presence, position, shape, condition, markings, foreign objects, and/or the like. In some examples, a separate network may be trained for up to each of the set of specific defect predictions using a labeled dataset corresponding to the defect. Each labeled dataset, for example, may comprise a set of labeled imagery data points that each comprise imagery and a binary label indicative whether the platform corresponding to the imagery exhibits a particular defect. In some examples, each model may be trained separately, using backpropagation of errors, to optimize a loss function (e.g., cross-entropy loss) designed to maximize the accuracy of the model with respect to the labels within the respective labeled dataset. In some examples, the initial condition prediction may comprise an aggregated prediction derived from a set of intermediate predictions from the individual defect-specific networks. For example, the initial condition prediction may comprise a weighted aggregate of the set of intermediate predictions. In some examples, the weights applied to each intermediate prediction may be determined from a lookup table that maps each defect to a particular severity level. In addition, or alternatively, the initial condition prediction may comprise a classification (e.g., subtask classification) that may be determined by applying a set of routing logic (e.g., each mapping a combination of the intermediate predictions to a subtask) to the set of intermediate predictions.

In some embodiments, a throughput optimization strategy employes a repair sequence that is configured to iteratively repair a platform in accordance with a virtual platform data object. The repair sequence may employ an arrangement of specialized repair stations, generalized repair stations, and/or hybrid sequences comprising a combination of specialized and generalized repair stations. In addition, or alternatively, the repair sequence may employ one or more collaborative and/or maintenance stations.

In some embodiments, the repair sequence comprises a collaborative repair process 614 that leverages a collaborative repair station to perform specialized repairs for a platform with a human-in-the-loop. The collaborative repair process 614, for example, may be performed using a collaborative system that comprises a user interface and one or more robotic components. The one or more robotic components may be controlled by the user interface to complete repairs that are outside the scope of automation repair processes 612A-D. In some examples, the user-provided controls may comprise affirmative and/or negative feedback with respect to a recommendation by a machine learning model. In addition, or alternatively, the user-provided controls may comprise new controls manually input by a user. At each repair iteration (and/or after a threshold number of iterations), the user-provided controls may be provided as additional inputs to one or more machine learning models (e.g., as ground truth data, positive training examples) of the present disclosure to enable online training techniques that may adapt the automation repair processes of the present disclosure to new, real world examples.

In some embodiments, the repair sequence comprises automation repair processes 612A-D that leverages one or more specialized repair stations to perform specialized repairs for a platform without a human-in-the-loop. Up to each of the one or more specialized repair stations, for example, may be configured for an automation repair process 612 that corresponds to a specialized subset of a set of repair subtasks. By way of example, a first automation repair process 612A may be configured for the repair of bottom and/or top boards of a platform, a second automation repair process 612B may be configured for top boards and/or center block of a platform, a third automation repair process 612C may be configured for bottom boards and/or blocks of a platform, a fourth automation repair process 612D may be configured for connector boards and/or blocks of the platform, and/or the like. In this case, pallets may be routed between different automation repair processes 612A-D (and/or repair stations thereof) to iteratively perform a subset of a set of repair subtasks identified by a virtual platform data object for the platform.

In some embodiments, the one or more specialized repair stations are dynamically configured in response to throughput data associated with a platform inspection facility. The throughput data, for example, may comprise historical data, such as historical damage profile trends, and/or the like, and/or current state data for a pallet inspection facility. The historical data, for example, may comprise one or more historical damage trends, inflow/outflow rates, and/or the like that describe a historical activity of a platform inspection facility. The current state data may comprise current damage states, current and/or predictive magazine/accumulator statuses, a number of in-progress, processed, and/or queued pallets, and/or the like that describes a current activity of the platform inspection facility. In some examples, the current state data may be stored and tracked by a damage tracker that identifies one or more metrics for a plurality of incoming pallets, such as number of incoming pallets requiring up to each of a set of repair subtasks.

In some examples, up to each of the one or more specialized repair stations may be configured by assigning a specialized repair sub-task to a generalized, full-stack repair station. In this manner, a set of generalized, full-stack repair stations may be operated in a modular manner to improve line balancing across the pallet inspection facility (e.g., by eliminating transition/set up times between multiple repair sub-tasks). For example, a set of repair stations may be dynamically switched between one or more sub-repair tasks based on the current state data for the pallet inspection facility. In some examples, the set of repair stations may be dynamically configured to reduce an overall current and/or prediction queue length at an accumulator for up to each of the set of repair stations. In addition, or alternatively, a repair station may be switched from a first repair sub-task to a second repair sub-task in response a queue length for the first repair sub-task meeting or exceeding a threshold. In this manner, the set of repair stations within a platform inspection facility may be dynamically reconfigured, on the fly, between a set of modular repair sub-tasks based on pallets received within the facility.

In some examples, the set of automation repair processes 612A-D may be arranged in a hierarchical repair scheme. For example, a first automation repair process 612A may be comprise a highest hierarchy followed by the second automation repair process 612B, third automation repair process 612C, and/or fourth automation repair process 612D in that order (or another order based on the facility). In such a case, a pallet may be initially routed to an automation repair process that is required for the platform and ranked the highest within the hierarchical repair scheme and then subsequently passed to the next highest ranked automation repair process required for the platform until the platform is completely repaired.

In some embodiments, the repair sequence comprises automation repair processes 612A-D that leverage a generalized repair stations to perform generalized repairs for a platform without a human-in-the-loop. For example, to improve throughput of the platform inspection facility, up to each of the automation repair processes 612A-D may be configured for up each of a set of the repair subtasks. In such a case, a pallet may be initially routed to an automation repair process based on the availability (and/or backlog size) of a set of repair stations configured for the set of automation repair processes 612A-D.

In some embodiments, the repair sequence comprises automation repair processes 612A-D that leverage a combination of specialized and/or generalized repair stations to perform hybrid repairs for a platform without a human-in-the-loop.

In some embodiments, the repair sequence comprises a maintenance process 806 that leverage a maintenance station to perform maintenance repairs for a platform without a human-in-the-loop. The maintenance process 806 may be configured for general maintenance that does not require replacement of a board, block, and/or other component of a platform.

In some embodiments, a throughput optimization strategy employes a finish process 616 that is configured to intake a repaired singulated platform, perform one or more finishing subtasks (e.g., branding, digitalization), and route the finished singulated platform to a segregated storage, as described in further detail with reference to FIG. 12.

FIG. 9 is an operational example 900 of at least a portion of a singulation system configured for the singulation process 802 in accordance with some embodiments discussed herein. The singulation system, for example, may comprise one or more robotic subsystems, such as a first robotic device configured for a set processing subtask and/or an extraction subtask, a second robotic device configured for an extraction subtask, and/or an arrangement of robotic devices configured for a platform processing subtask. The operational example 900 provides one example of a singulation system that comprises one or more robotic arms 902, a conveyor assembly 904, a vertical platform infeed 906, a rolling module 908, a platform topper and wrap removal module 910, a stable removal module 912, a brushing module 914, a platform rotator 916, and/or the like.

Figure 10:
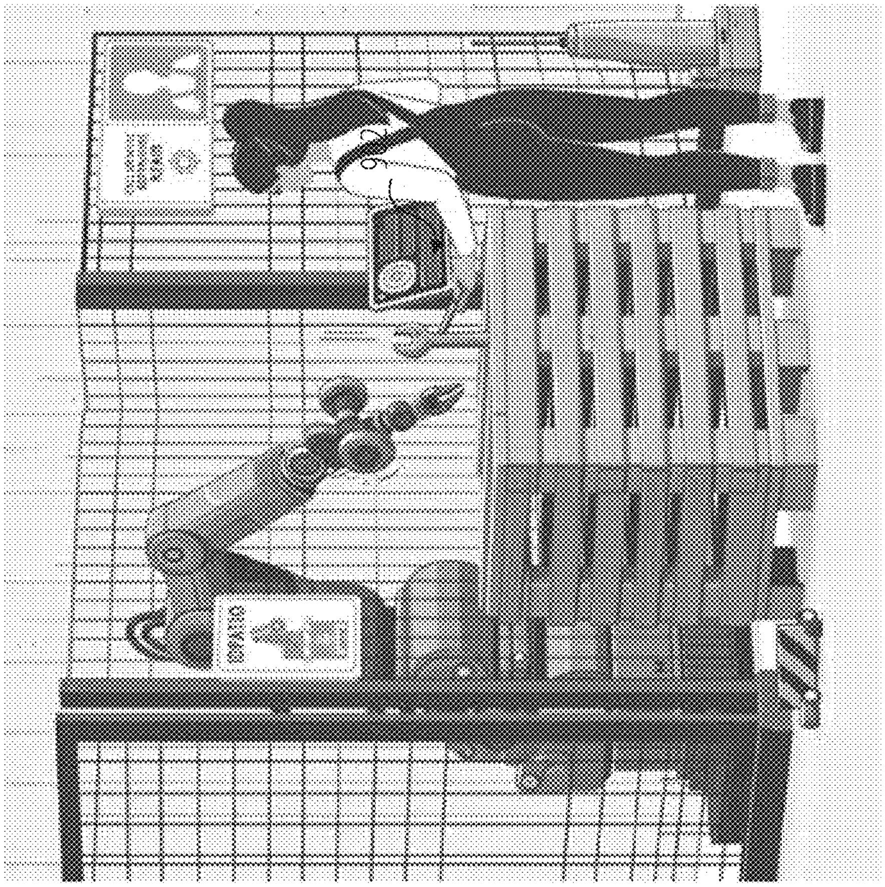
FIG. 10 is an operational example of a collaborative repair system configured for the collaborative repair process in accordance with some embodiments discussed herein.

FIG. 10 is an operational example 1000 of a collaborative repair system 408 configured for the collaborative repair process 614 in accordance with some embodiments discussed herein. As depicted, the collaborative repair system 408 may comprise one or more robotic arms and a user interface that is accessible to a user for providing instructions to the robotic arm.

Figure 11:
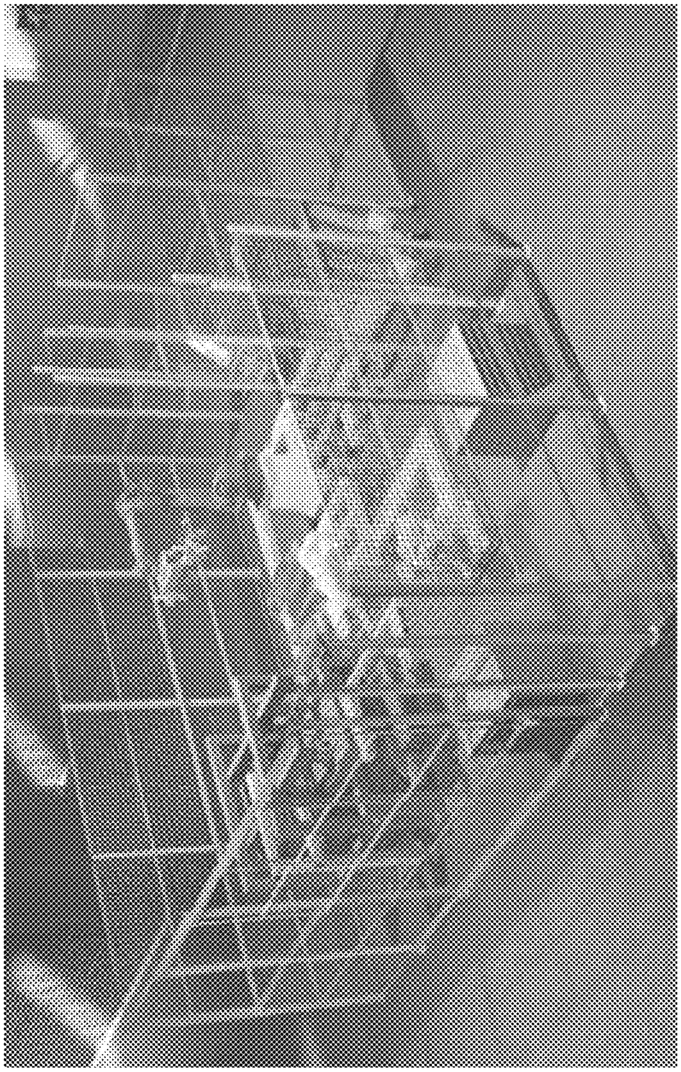
FIG. 11 is an operational example of an automation repair system configured for one or more of the automation repair processes and/or maintenance process in accordance with some embodiments discussed herein.

FIG. 11 is an operational example 1100 of an automation repair system 410 configured for one or more of the automation repair processes 612A-D and/or maintenance process 806 in accordance with some embodiments discussed herein. As depicted, the automation repair system 410 may comprise one or more robotic arms, a workstation, and/or other components for performing a specialized and/or generalized set of repair subtasks.

Figure 12:
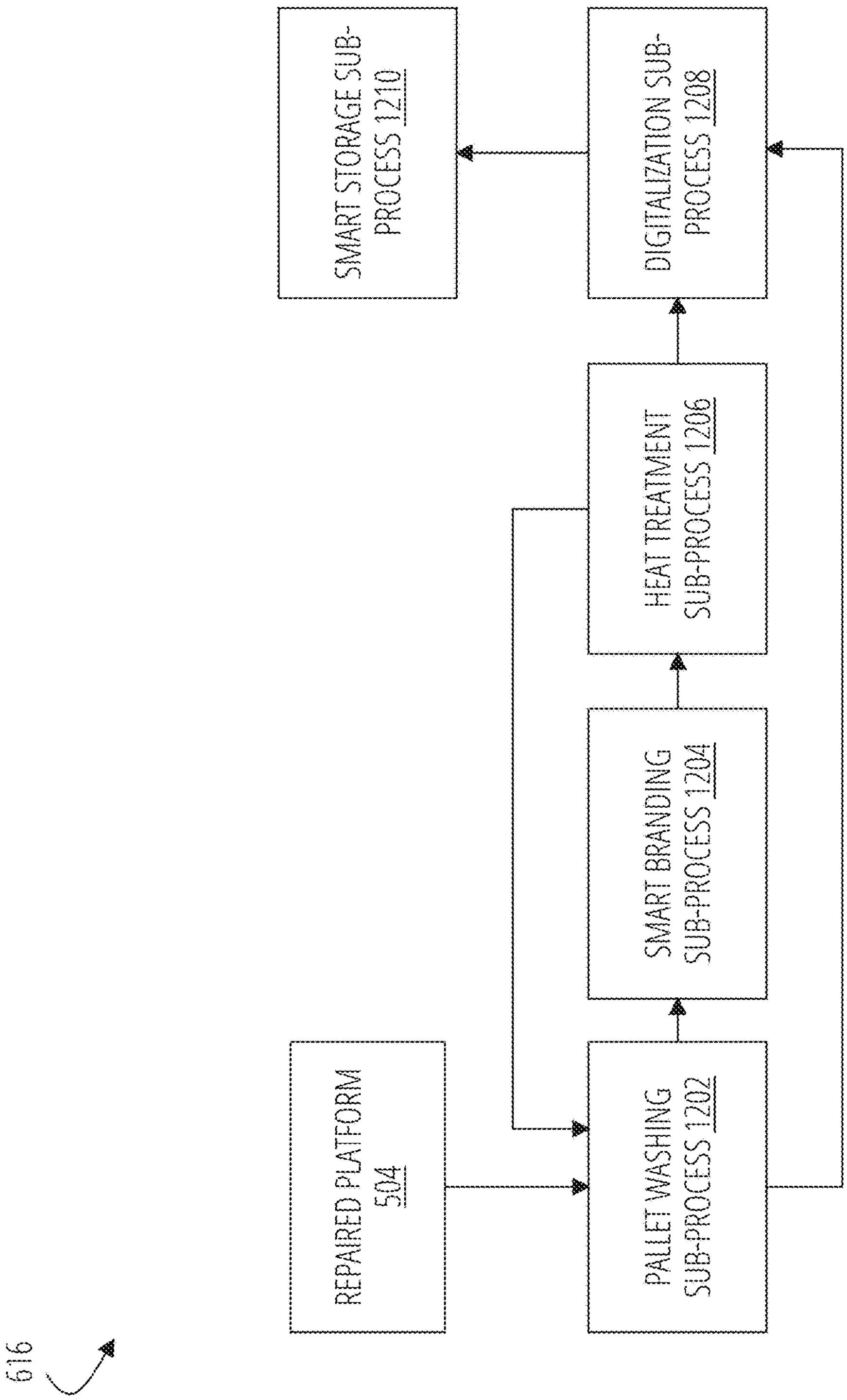
FIG. 12 is a dataflow diagram of the finish process in accordance with some embodiments discussed herein.

FIG. 12 is a dataflow diagram of the finish process 616 in accordance with some embodiments discussed herein.

In some embodiments, the finish process 616 comprises a pallet washing sub-process 1202 configured to remove extraneous material, such as residual material from preceding repair operations, loose material, debris, and/or the like, from a repaired platform 514.

In some embodiments, the finish process 616 comprises a smart branding sub-process 1204 configured to apply, rehabilitate, and/or otherwise imprint or repair a design on a surface area of the repaired platform 504. In some examples, the smart branding sub-process 1204 may be performed by a smart branding system that comprises a vision system, one or more robotic arms, a control unit, and/or the like, as depicted in the operational example 1100, to selectively adhere paint or other branding matter to a platform. The control unit, for example, may scan (e.g., using the vision system) a repaired platform 504 to determine one or more branding sub-tasks that break the smart branding sub-process 1204 into a set of selective paint adhering operations. The control unit may iteratively instruct the one or more robotic arms to apply paint or other branding matter to the platform in accordance with the one or more branding sub-tasks. In some examples, the control unit may rescan the platform after up to each of the one or more branding sub-tasks to dynamically update the branding sub-tasks as they are performed. In this way, the smart branding sub-process 1204 may selectively apply branding matter to a platform to rehabilitate an existing brand without reapplying the entire brand after each repair.

In some embodiments, the finish process 616 comprises a heat treatment sub-process 1206 configured to thermally seal a singulated platform before a digitalization sub-process.

In some embodiments, the finish process 616 comprises a digitalization sub-process 1208 configured to apply, repair, and/or otherwise service a tracking mechanism for a platform. The digitalization sub-process 1208 may be performed by a digitalization system that comprises one or more vision systems, robotic arms, control units, and/or the like. In some examples, the identification tags may comprise radio frequency tags and control unit may be configured to scan (e.g., using a vision system) a platform to identify an attachment location (e.g., a block) and instruct at least one of the robotic arms to attach the radio frequency tag to the attachment location.

In some embodiments, the finish process 616 comprises a smart storage sub-process 1210 configured to route the platform to a segregated storage location based on one or more platform attributes. The smart storage sub-process 1210, for example, may access a virtual platform data object to determine a platform owner and route the platform to a segregation storage location associated with the platform owner. In addition, or alternatively, the smart storage sub-process 1210 may access the virtual platform data object to determine a platform state of the platform. The smart storage sub-process 1210 may determine the segregation storage location based on a comparison between the platform state and a condition threshold associated with up to each of a set of platform owners. In this manner, a platform may be shared across a set of platform owners based on a required platform state requirements of the use cases (e.g., food transportation, storage of construction materials) engaged in by up to each of the set of platform owners.

Figure 13:
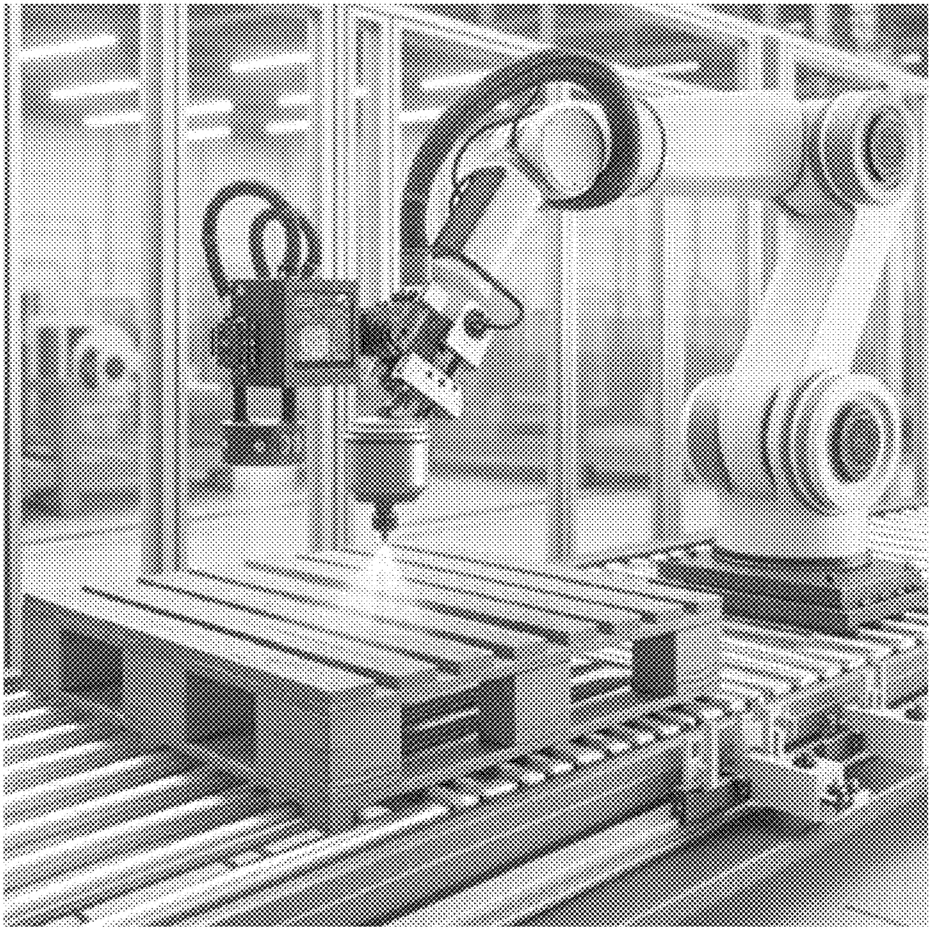
FIG. 13 depicts an operational example of a smart branding system configured for a branding sub-process in accordance with some embodiments discussed herein.

FIG. 13 depicts an operational example 1400 of a smart branding system configured for a branding sub-process 1204 in accordance with some embodiments discussed herein. As depicted, the smart branding system may comprise a vision system, a robotic arm, and/or a control unit collectively configured to apply a paint (or other matter) on the surface of a platform.

Figure 14:
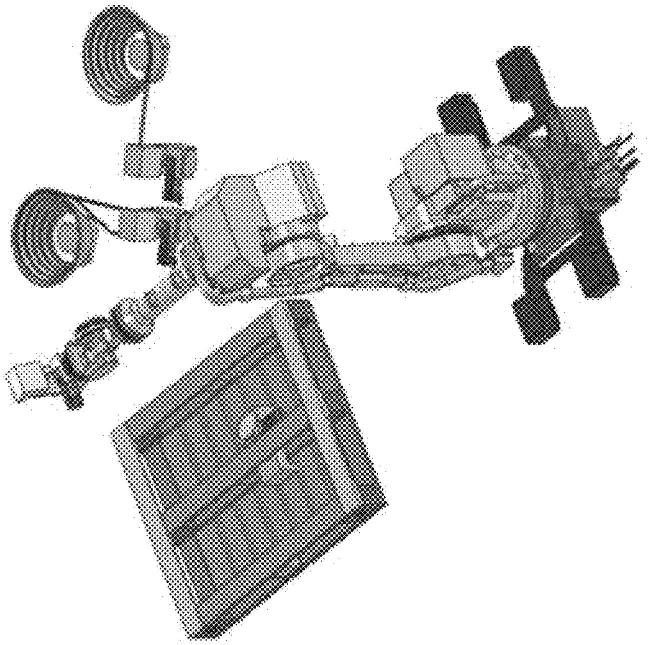
FIG. 14 depicts operational examples and of a digitalization system configured for a digitalization sub-process in accordance with some embodiments discussed herein.
Figure 14:
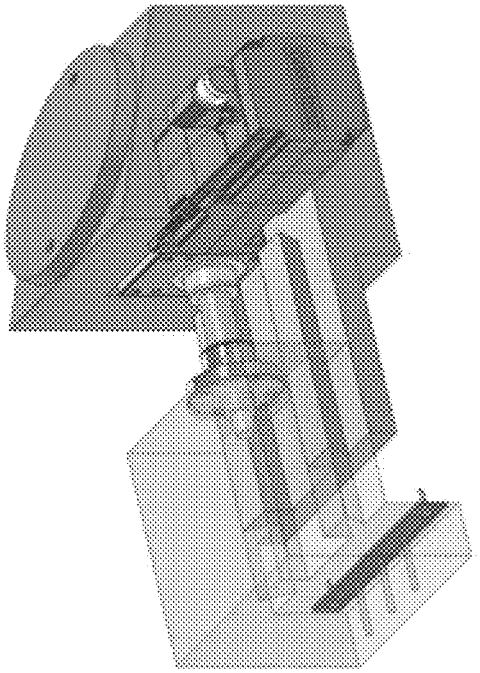

FIG. 14 depicts operational examples 1400 and 1450 of a digitalization system configured for a digitalization sub-process 1208 in accordance with some embodiments discussed herein. The first operational example 1400, for example, comprises a radio frequency tag (e.g., an active or passive RFID beacon) that may be attached to a block of platform. The second operational example 1450 comprises a robotic arm configured to attach the radio frequency tag to the block of the platform.

V. CONCLUSION

Many modifications and other embodiments will come to mind to one skilled in the art to which the present disclosure pertains having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An automated platform handling method comprising:

receiving, at a platform inspection facility, a plurality of platforms;

initiating, using an inspection system of the platform inspection facility, a universal inspection subtask to generate an initial sensor-based compliance score for a platform of the plurality of platforms, wherein the initial sensor-based compliance score comprises a percentage value that identifies a predicted level of repair to rehabilitate the platform;

routing, using a robotic transportation device of the platform inspection facility, the platform to a first modular repair station of a plurality of modular repair stations of the platform inspection facility based on the initial sensor-based compliance score;

initiating, using a first modular repair system corresponding to the first modular repair station, a repair subtask for the platform;

generating, using the first modular repair system, a subsequent sensor-based compliance score in addition to the initial sensor-based compliance score;

routing, using the robotic transportation device, the platform to a second modular repair station of the plurality of modular repair stations based on the subsequent sensor-based compliance score; and verifying, using a second modular repair system corresponding to the second modular repair station, a condition of the platform.

2. The automated platform handling method of claim 1, wherein the inspection system comprises a sensor system configured to generate one or more inspection images of the platform and an inspection module configured to generate the initial sensor-based compliance score based on the one or more inspection images.

3. The automated platform handling method of claim 1, further comprising identifying the first modular repair station based on a comparison between the initial sensor-based compliance score and a plurality of repair subtask thresholds.

4. The automated platform handling method of claim 3, further comprising:

determining an unrecoverability determination for the platform based on a comparison between the initial sensor-based compliance score and an unrecoverability threshold; and in response to the unrecoverability determination, routing the platform to a manual intervention station.

5. The automated platform handling method of claim 1, wherein the first modular repair system comprises a sensor system configured to generate one or more subsequent inspection images of the platform, and an inspection module configured to generate the subsequent sensor-based compliance score based on the one or more subsequent inspection images.

6. The automated platform handling method of claim 5, wherein initiating the repair subtask comprises:

initiating, based on the one or more subsequent inspection images, one or more repair operations to modify the condition of the platform;

generating one or more terminating inspection images of the platform; and generating a terminating sensor-based compliance score based on the one or more terminating inspection images.

7. The automated platform handling method of claim 6, wherein routing the platform to the second modular repair station based on the repair subtask comprises identifying the second modular repair station based on a comparison between the terminating sensor-based compliance score and a plurality of repair subtask thresholds.

8. The automated platform handling method of claim 1, wherein:

(i) the plurality of modular repair stations is associated with a hierarchical repair subtask scheme that defines an order of a plurality of repair tasks, and (ii) each of the plurality of modular repair stations correspond to one of the plurality of repair tasks.

9. The automated platform handling method of claim 1, wherein the platform inspection facility is associated with a routing layout that defines one or more travel paths between the inspection system and the plurality of modular repair stations.

10. The automated platform handling method of claim 9, wherein the one or more travel paths are defined by a plurality of geofences or a plurality of directional movements.

11. The automated platform handling method of claim 1, wherein the robotic transportation device comprises an autonomous mobile robot that comprises a vision system, one or more arms, and one or more end effectors.

12. The automated platform handling method of claim 11, wherein the robotic transportation device autonomously navigates within the platform inspection facility using simultaneous localization and mapping.

13. The automated platform handling method of claim 11, wherein the robotic transportation device is configured to translate and rotate the platform, via the one or more arms, with a plurality of degrees of freedom.

14. A system comprising:

an inspection system;

a robotic transportation device;

a first modular repair system;

second modular repair system; and a management system comprising:

one or more processors; and one or more memories storing processor-executable instructions that, when executed by the one or more processors, cause the one or more processors to perform operations comprising:

receiving, at a platform inspection facility, a plurality of platforms;

initiating, using the inspection system of the platform inspection facility, a universal inspection subtask to generate an initial sensor-based compliance score for a platform of the plurality of platforms, wherein the initial sensor-based compliance score comprises a percentage value that identifies a predicted level of repair to rehabilitate the platform;

routing, using the robotic transportation device of the platform inspection facility, the platform to a first modular repair station of a plurality of modular repair stations of the platform inspection facility based on the initial sensor-based compliance score;

initiating, using the first modular repair system corresponding to the first modular repair station, a repair subtask for the platform;

generating, using the first modular repair system, a subsequent sensor-based compliance score in addition to the initial sensor-based compliance score;

routing, using the robotic transportation device, the platform to a second modular repair station of the plurality of modular repair stations based on the subsequent sensor-based compliance score; and verifying, using the second modular repair system corresponding to the second modular repair station, a condition of the platform.

15. The system of claim 14, wherein the robotic transportation device comprises an autonomous mobile robot that comprises a vision system, one or more arms, and one or more end effectors.

16. The system of claim 14, wherein:

(i) the plurality of modular repair stations is associated with a hierarchical repair subtask scheme that defines an order of a plurality of repair tasks, and (ii) each of the plurality of modular repair stations correspond to one of the plurality of repair tasks.

17. The system of claim 14, wherein the inspection system comprises a sensor system configured to generate one or more inspection images of the platform and an inspection module configured to generate the initial sensor-based compliance score based on the one or more inspection images.

18. One or more non-transitory computer-readable media storing processor-executable instructions that, when executed by one or more processors, cause the one or more processors to perform operations comprising:

receiving, at a platform inspection facility, a plurality of platforms;

initiating, using an inspection system of the platform inspection facility, a universal inspection subtask to generate an initial sensor-based compliance score for a platform of the plurality of platforms, wherein the initial sensor-based compliance score comprises a percentage value that identifies a predicted level of repair to rehabilitate the platform;

routing, using a robotic transportation device of the platform inspection facility, the platform to a first modular repair station of a plurality of modular repair stations of the platform inspection facility based on the initial sensor-based compliance score;

initiating, using a first modular repair system corresponding to the first modular repair station, a repair subtask for the platform;

generating, using the first modular repair system, a subsequent sensor-based compliance score in addition to the initial sensor-based compliance score;

routing, using the robotic transportation device, the platform to a second modular repair station of the plurality of modular repair stations based on the subsequent sensor-based compliance score; and verifying, using a second modular repair system corresponding to the second modular repair station, a condition of the platform.

19. The one or more non-transitory computer-readable media of claim 18, wherein the first modular repair system comprises a sensor system configured to generate one or more subsequent inspection images of the platform, and an inspection module configured to generate the subsequent sensor-based compliance score based on the one or more subsequent inspection images, and the operations further comprise:

initiating, based on the one or more subsequent inspection images, one or more repair operations to modify the condition of the platform;

generating one or more terminating inspection images of the platform; and generating a terminating sensor-based compliance score based on the one or more terminating inspection images.

* * * * *